(12) United States Patent
Richter et al.

(10) Patent No.: US 9,569,942 B2
(45) Date of Patent: Feb. 14, 2017

(54) SENSOR SYSTEM FOR PROTECTION OF ARTWORKS AND OTHER VALUABLE OBJECTS

(71) Applicants: Vootner Goushe LLC, Weston, CT (US); ELK Products, Inc., Connelly Springs, NC (US)

(72) Inventors: Robert S. Richter, Weston, CT (US); William S. Anderson, Brooklyn, NY (US); Joel C. Rosson, Hickory, NC (US); David C. Steele, Hickory, NC (US)

(73) Assignees: VOOTNER GOUSHE LLC, Weston, CT (US); ELK PRODUCTS, INC., Connelly Springs, NC (US)

( * ) Notice: Subject to any disclaimer, the term of this patent is extended or adjusted under 35 U.S.C. 154(b) by 92 days.

(21) Appl. No.: 14/429,216

(22) PCT Filed: Sep. 17, 2013

(86) PCT No.: PCT/US2013/060228
§ 371 (c)(1),
(2) Date: Mar. 18, 2015

(87) PCT Pub. No.: WO2014/047078
PCT Pub. Date: Mar. 27, 2014

(65) Prior Publication Data
US 2015/0262461 A1     Sep. 17, 2015

Related U.S. Application Data

(60) Provisional application No. 61/702,422, filed on Sep. 18, 2012.

(51) Int. Cl.
*G08B 13/24* (2006.01)
*G01R 33/02* (2006.01)
(Continued)

(52) U.S. Cl.
CPC ............... *G08B 13/24* (2013.01); *G01R 33/02* (2013.01); *G08B 13/149* (2013.01); *G08B 13/1436* (2013.01); *G08B 29/183* (2013.01)

(58) Field of Classification Search
CPC . G08B 13/08; G08B 13/2491; G08B 13/1436; G08B 25/008; G08B 29/183; G08B 13/149; G08B 13/14; G08B 13/1427; G08B 13/2402; G01R 33/02
(Continued)

(56) References Cited

U.S. PATENT DOCUMENTS 3,305,805 A    2/1967   Tann
3,745,553 A    7/1973   Kardashian
(Continued)

FOREIGN PATENT DOCUMENTS

GB           2399927 A         9/2004
KR    10-2009-0049344 A        5/2009
(Continued)

OTHER PUBLICATIONS

Euronova Ltd, "GalleryMaster—Wire Free Sensors—Product List 2011", Accessed via http://www.euronova.co.uk/cgi-bin/PDF%20Files/Wire%20free%20sensors.pdf on Feb. 13, 2012, pp. 1-2.
(Continued)

*Primary Examiner* — Mirza Alam
(74) *Attorney, Agent, or Firm* — Hultquist, PLLC; Steven J. Hultquist

(57) ABSTRACT

Systems, devices, and methods are disclosed for securing a theft-susceptible movable object at a selected location. A security system is positioned at a selected location for protection of a theft-susceptible movable object. The security system includes a magnetic field source adapted to generate a magnetic field that is positionally-associated with a movable object. A monitoring device includes a magnetic
(Continued)

sensor and is adapted for placement proximate to the selected location. The monitoring device is adapted to take one or more measurements of the magnetic field and to detect alteration in the measurements caused by movement of the magnetic field source relative to the monitoring device when the movable object is moved from the selected location. Upon detecting the alteration in the measurements of the magnetic field, the monitoring device is adapted to output an electronic warning signal indicating that the movable object has moved from the selected location.

20 Claims, 13 Drawing Sheets

(51) Int. Cl.
G08B 13/14 (2006.01)
G08B 29/18 (2006.01)

(58) Field of Classification Search
USPC .................................................. 340/568.1
See application file for complete search history.

(56) References Cited

U.S. PATENT DOCUMENTS

| | | | |
|---|---|---|---|
| 4,359,646 A | 11/1982 | Mejia et al. | |
| 4,507,654 A | 3/1985 | Stolarczyk et al. | |
| 4,812,674 A | 3/1989 | Sue et al. | |
| 5,004,999 A | 4/1991 | Hartmann et al. | |
| 5,155,469 A | 10/1992 | Hartmann et al. | |
| 5,534,849 A | 7/1996 | McDonald et al. | |
| 5,633,626 A * | 5/1997 | Cawthorne | G08B 13/08 335/206 |
| 5,654,686 A | 8/1997 | Geschke et al. | |
| 6,151,563 A | 11/2000 | Marinelli | |
| 6,310,549 B1 * | 10/2001 | Loftin | G08B 13/08 324/207.21 |
| 6,472,993 B1 | 10/2002 | Addy | |
| 6,724,316 B2 | 4/2004 | Addy et al. | |
| 6,784,796 B2 | 8/2004 | Johnston et al. | |
| 6,882,275 B2 | 4/2005 | Blanpain et al. | |
| 6,963,281 B2 | 11/2005 | Buckley | |
| 7,119,681 B2 | 10/2006 | Eskildsen | |
| 7,120,795 B2 | 10/2006 | Raphael et al. | |
| 7,356,429 B2 | 4/2008 | Eskildsen | |
| 7,663,483 B2 | 2/2010 | Spenik et al. | |
| 7,986,232 B2 | 7/2011 | Sharma | |
| 2002/0190860 A1 * | 12/2002 | Flament | G01V 15/00 340/551 |
| 2003/0071739 A1 * | 4/2003 | Addy | G08B 13/08 340/686.1 |
| 2003/0076229 A1 * | 4/2003 | Blanpain | G08B 13/1436 340/551 |
| 2010/0141365 A1 | 6/2010 | Edmonson, Jr. | |
| 2010/0219951 A1 | 9/2010 | Sosa | |
| 2010/0302025 A1 * | 12/2010 | Script | G01P 15/09 340/539.1 |
| 2011/0227735 A1 * | 9/2011 | Fawcett | G08B 13/149 340/568.8 |
| 2013/0265162 A1 | 10/2013 | Buckley et al. | |

FOREIGN PATENT DOCUMENTS

| | | |
|---|---|---|
| KR | 10-2011-0067002 A | 6/2011 |
| WO | 0169561 A1 | 9/2001 |

OTHER PUBLICATIONS

Euronova Ltd, "Products and Services", Accessed via http://www.euronova.co.uk/cgi-bin/products.asp on Feb. 13, 2012, pp. 1-2.
Euronova Ltd, "Sensors", Accessed via http://www.euronova.co.uk/cgi-bin/sensors.asp on Feb. 13, 2012, pp. 1-3.
Honeywell International Inc., "968XTP Maximum Security Switch—Installation Instructions", 2006, pp. 1-2.
Honeywell International Inc., "HMC5883L 3-Axis Digital Compass IC", Oct. 2010, pp. 1-4.
Honeywell International Inc., "5816OD Outdoor Wireless Contact/Transmitter", Oct. 2011, pp. 1-2.
Multidimension Technology Co., Ltd., "MMLP57H TMR Linear Sensor", Nov. 14, 2011, pp. 1-3.
Stanley, M., "Magnetometers come in multiple flavors", "freescale Blog", Accessed via http://blogs.freescale.com/sensors/2011/03/magnetometers-come-in-multiple-flavors/, Mar. 4, 2011, pp. 1-7.

* cited by examiner

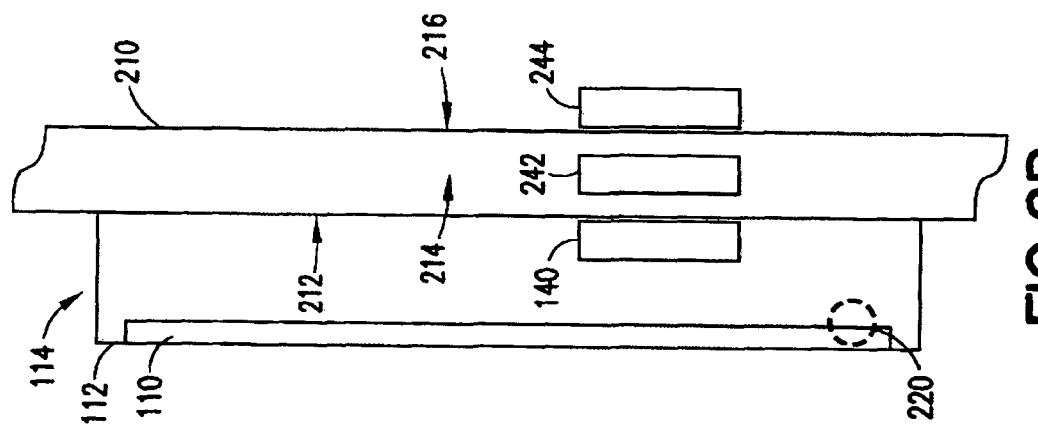
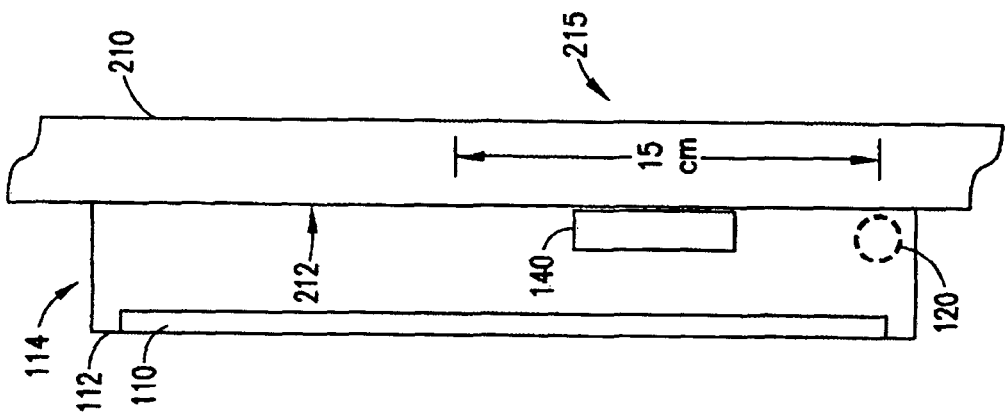

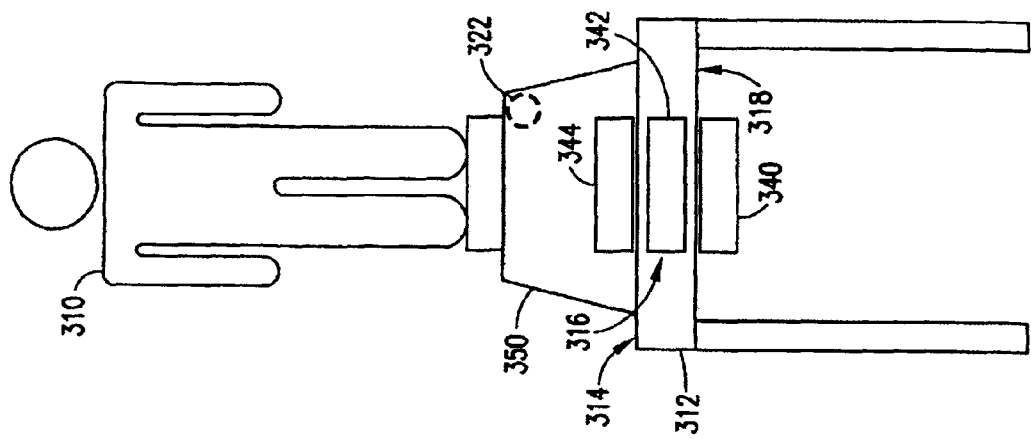
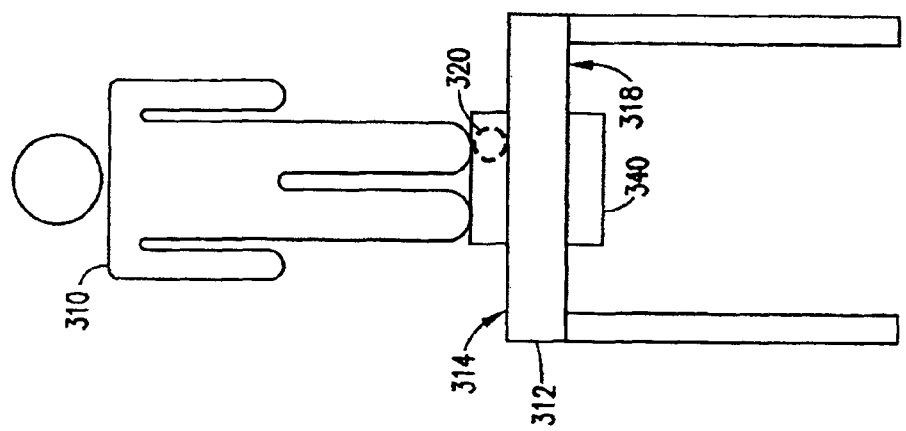

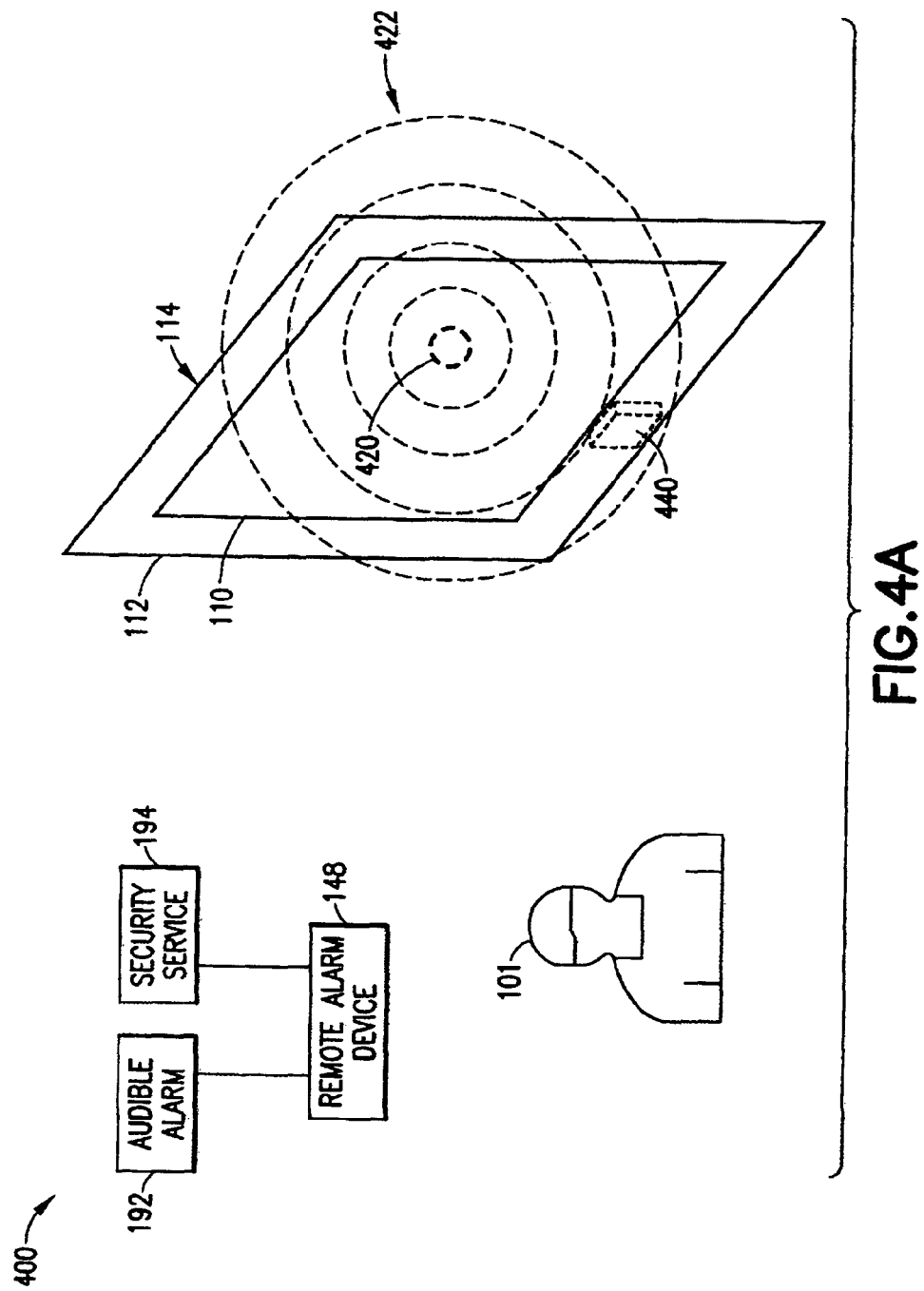

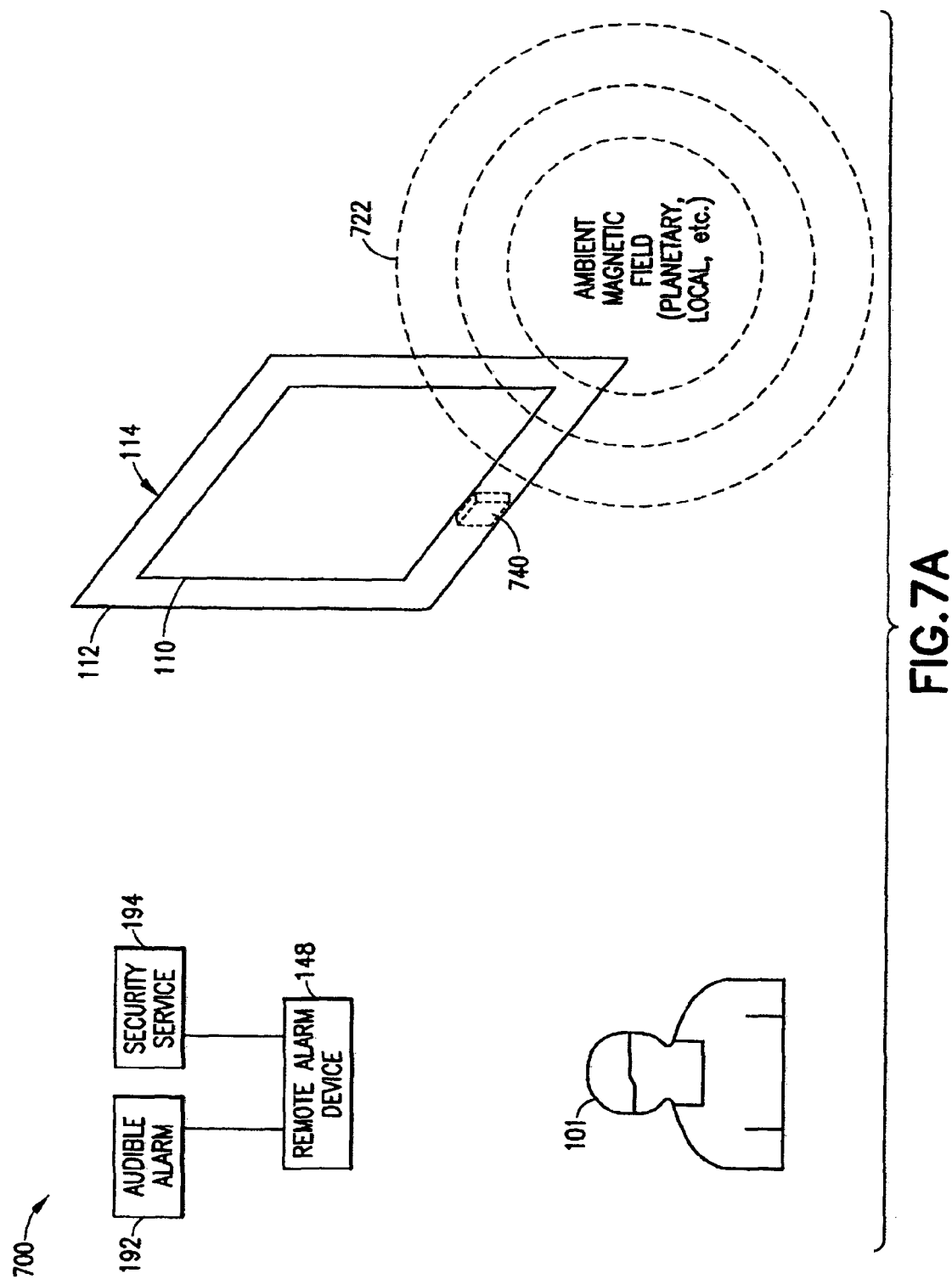

SENSOR SYSTEM FOR PROTECTION OF ARTWORKS AND OTHER VALUABLE OBJECTS

CROSS-REFERENCE TO RELATED APPLICATIONS

This application is a U.S. national phase under the provisions of 35 U.S.C. §371 of International Patent Application No. PCT/US13/60228 filed Sep. 17, 2013 in the names of Robert S. Richter, et al. for "SENSOR SYSTEM FOR PROTECTION OF ARTWORKS AND OTHER VALUABLE OBJECTS", which in turn claims the benefit of priority under 35 U.S.C. §119 of United States Provisional Patent Application No. 61/702,422 filed Sep. 18, 2012 in the names of Robert S. Richter et al. for "SENSOR SYSTEM FOR PROTECTION OF ARTWORKS AND OTHER VALUABLE OBJECTS". The disclosures of such International Patent Application No. PCT/US13/60228 and U.S. Provisional Patent Application No. 61/702,422 are hereby incorporated herein by reference in their entireties, for all purposes.

FIELD OF THE INVENTION

The present invention relates to systems, methods, and apparatuses for sensing movement of a valuable object, such as an artwork or an antique, and generating a signal indicating movement of the valuable object.

BACKGROUND

Some valuable objects, such as jewels or precious metals, may be protected from theft or damage by locking them in vault or safe deposit box. However, for other valuable objects, it may be desirable for the objects to be kept in an open location so that they can be displayed or accessed. For example, it may be desirable to display artworks, such as paintings, sculpture, or fine pottery, antiques, cultural artifacts, or historical artifacts so that they may be readily enjoyed. Also, high quality electronics, such as laptop computers or high-quality audio or video components, should be readily accessible so that they can be used and enjoyed. Locking up artworks and various other valuable objects in safes, vaults, safe deposit boxes, rooms with restricted access, or other secured spaces would diminish the ability to enjoy them.

There are various ways to protect valuable objects without locking them in a vault or safe deposit box. For example, some artworks are locked in protective transparent cases. Additionally, museums may employ motion-based sensors that use lasers, infrared beams, or pressure sensors to detect movement occurring within an unacceptable proximity of the artwork. These sensors trigger an alarm when one or more persons come within a distance that is overly close to an artwork or impermissibly tries to touch or handle the artwork. Wall-mounted objects, such as paintings, may be hung on a device secured to the wall that is sensitive to movement of the painting and that will sound an alarm if the painting were to be lifted from its mounting. Sculptures or other objects that generally rest atop a surface may be protected by one or more pressure-sensitive pads placed beneath the object on a floor, pedestal, or other supporting surface, where the pressure-sensitive pads trigger an alert if the object is lifted from its resting location. Portable, battery-operated motion-sensing devices may be mounted on artworks or other objects that may sound an alarm if the object is moved. Other objects, such as computers, may be protected simply by chaining or otherwise securing them to a desk, table or other fixed structure with a tether, such as a Kensington® lock.

However, existing commercially available systems are not suitable for all uses. For example, it may not be desirable or cost-effective to erect protective cases around artworks. Many motion-based systems using lasers, infrared beams or other methodologies may be too costly or may be impractical for use in homes, offices, small galleries, and other locations. Moreover, in homes, offices, galleries, and some museums, it may be undesirable to keep people at a distance from artworks; it may be desirable to allow visitors or owners to appreciate the work from a close distance.

It also may be undesirable to mount a battery-operated device, such as a battery-powered motion detector, on some types of artworks. Regular replacement of the battery may subject the artwork to an undesirable degree of handling. Moreover, if the batteries were to leak, caustic chemicals seeping from the batteries may cause damage to the artwork to which the battery-powered device is mounted. For sculptures, fine pottery, or other small artworks or precious objects, it may be challenging to attach a battery-powered device to the object.

Finally, many existing systems may simply be aesthetically undesirable. Some devices designed to be attached to an artwork or designed to rest beneath or behind an artwork may detract from the enjoyment of the artwork it is designed to protect.

Thus, it would be desirable to protect an artwork or other valuable object from theft or damage by providing a way to detect movement of the artwork or valuable object indicative of possible theft or other undesired handling of the object, without the requirement of devices that are overly complex, costly, or bulky, that are aesthetically unappealing, or that pose a risk of damage to the artwork or other valuable object.

SUMMARY

The present disclosure relates to systems, devices, and methods for securing a theft-susceptible movable object at a selected location by generating a signal to warn of the movable object being moved. Specifically, a magnetic field source is attached to or otherwise positionally-associated with the movable object, and a monitoring device placed in proximity to the selected location detects alterations in measurements of the magnetic field that result from movement of the movable object. Alternatively, a monitoring device may be positionally-associated with the movable object to detect alterations in measurements of a magnetic field generated by a magnetic field source that is positioned proximate to the selected location or a planetary magnetic field or other ambient magnetic field that would result from movement of the movable object and the associated monitoring device. Upon detecting alteration in the measurements of the magnetic field resulting from movement of the movable object, a warning signal is generated to warn that the movable object has been moved. When the monitoring device is positionally-associated with the movable object and configured to detect changes in measurements of an ambient magnetic field, the monitoring device also may include a motion sensing device such that, after movement of the movable object is detected by the motion sensor, the monitoring device then takes measurements of the ambient magnetic field to determine whether the movable object is moved from the selected location by more than a threshold amount.

According to one embodiment of the present disclosure, a security system is positioned at a selected location for protection of a theft-susceptible movable object. The security system includes a magnetic field source adapted to generate a magnetic field that is positionally-associated with a movable object. A monitoring device includes a magnetic sensor and is adapted for placement proximate to the selected location. The monitoring device is adapted to take one or more measurements of the magnetic field and to detect alteration in the measurements caused by movement of the magnetic field source relative to the monitoring device when the movable object is moved from the selected location. Upon detecting the alteration in the measurements of the magnetic field, the monitoring device is adapted to output an electronic warning signal indicating that the movable object has moved from the selected location.

According to another embodiment of the present disclosure, a security system is positioned at a selected location for protection of a theft-susceptible movable object. A magnetic field source adapted to generate a magnetic field is placed in proximity to the selected location. A monitoring device is positionally-associated with a movable object. The monitoring device includes a magnetic sensor and is adapted to be positionally-associated with a movable object, and to take one or more measurements of the magnetic field. The monitoring device is thus adapted to detect alteration in the one or more measurements caused by movement of the monitoring device relative to the magnetic field source when the movable object is moved from the selected location. The monitoring device is adapted to output an electronic warning signal indicating that the movable object has moved from the selected location upon detecting the alteration in the one or more measurements of the magnetic field.

According to a further embodiment, a monitoring device detects movement of a magnetic field associated with a movable object. The monitoring device is adapted to be positioned proximate to a selected location of the movable object and includes a magnetic sensor adapted to take one or more measurements of a magnetic field generated by a passive magnetic source positionally-associated with the movable object. The magnetic sensor is not physically coupled to or in contact with the movable object. The monitoring device further includes a controller operably coupled to the magnetic sensor, such that the controller is adapted to direct the magnetic sensor to take the one or more measurements of the magnetic field. The monitoring device generates a signal in response to an alteration in the one or more measurements of the magnetic field caused by movement of the passive magnetic field-generating source relative to the magnetic sensor. The monitoring device further includes a signaling device coupled to the controller and responsive to the signal. The signaling device is adapted to generate a warning signal indicating the movement of the movable object away from the selected location. The monitoring device may also include a power source operably coupled to the magnetic sensor, to the controller, and to the signaling device to provide electrical power to these devices.

According to a still further embodiment, a monitoring device is positionally-associated with a movable object and is adapted to detect movement relative to a passive magnetic field source positioned proximate to a selected location of the movable object. The monitoring device includes a magnetic sensor adapted to take one or more measurements of a magnetic field generated by a passive magnetic source. The monitoring device further includes a controller operably coupled to the magnetic sensor, and adapted to direct the magnetic sensor to take the one or more measurements of the magnetic field. The monitoring device generates a signal in response to an alteration in the one or more measurements of the magnetic field caused by movement of the monitoring device relative to the passive magnetic field-generating source. The monitoring device further includes a signaling device coupled to the controller and responsive to the signal. The signaling device is adapted to generate a warning signal indicating the movement of the movable object away from the selected location. The monitoring device may also include a power source operably coupled to the magnetic sensor, to the controller, and to the signaling device to provide electrical power to these devices.

According to still another embodiment, a monitoring device is positionally-associated with a movable object for detecting movement of the movable object from a selected location. The monitoring device includes a motion sensor adapted to detect movement of the movable object and a magnetic sensor adapted to take one or more measurements of an ambient magnetic field. The monitoring device also includes a controller operably coupled to the motion sensor and the magnetic sensor such that, when the motion sensor detects movement of the movable object, the controller is adapted to direct the magnetic sensor to take the one or more measurements of the ambient magnetic field. The controller is further adapted to generate a signal in response to an alteration in the one or more measurements of the ambient magnetic field caused by movement of the monitoring device relative to the selected location by more than a threshold amount. The monitoring device includes a signaling device coupled to the magnetic sensor and responsive to the signal, such that the signaling device is adapted to generate a warning signal indicating the movement of the movable object away from the selected location. A power source may be operably coupled to motion sensor, the magnetic sensor, and the signaling device to provide electrical power to the motion sensor, the magnetic sensor, and the signaling device.

According to yet another embodiment, a method of securing a theft-susceptible movable object at a selected location is described. A magnetic field is monitored with a monitoring device, where monitoring the magnetic field yields consistent measurements when the object is positioned at the selected location. Movement of the movable object from the selected location results in an alteration of the measurements of the magnetic field. Upon detection of the alteration in one or more measurements of the magnetic field, a signal is responsively outputted indicating that the movable object has moved from the selected location.

Other aspects, features and embodiments of the disclosure will be more fully apparent from the ensuing description and appended claims.

BRIEF DESCRIPTION OF THE DRAWINGS

FIGS. 2A and 2B are schematic diagrams of an artwork adapted for hanging on a wall including embodiments of a magnetic field source affixed to a frame of the artwork or the artwork itself, and a monitoring device mounted on a surface of the wall behind the object, within the wall, and behind the wall;

FIGS. 3A and 3B are schematic diagrams of an artwork adapted to rest upon a supporting surface including embodiments of a magnetic field source affixed directly to the artwork or to a base coupled to the artwork, and a monitoring device positioned beneath the artwork atop the supporting surface, within the supporting surface, and beneath the supporting surface;

FIGS. 4A and 4B are schematic diagrams of an embodiment of a security system including a monitoring device positionally-associated with a theft-susceptible movable object and a magnetic field source mounted proximate to a selected location for the movable object;

FIGS. 7A and 7B are schematic diagrams showing an embodiment of a monitoring device positionally-associated with a movable object, such as an artwork, adapted to detect alterations in measurements of an ambient magnetic field indicative of movement of the movable object from a selected location;

DETAILED DESCRIPTION

Figure 1A:
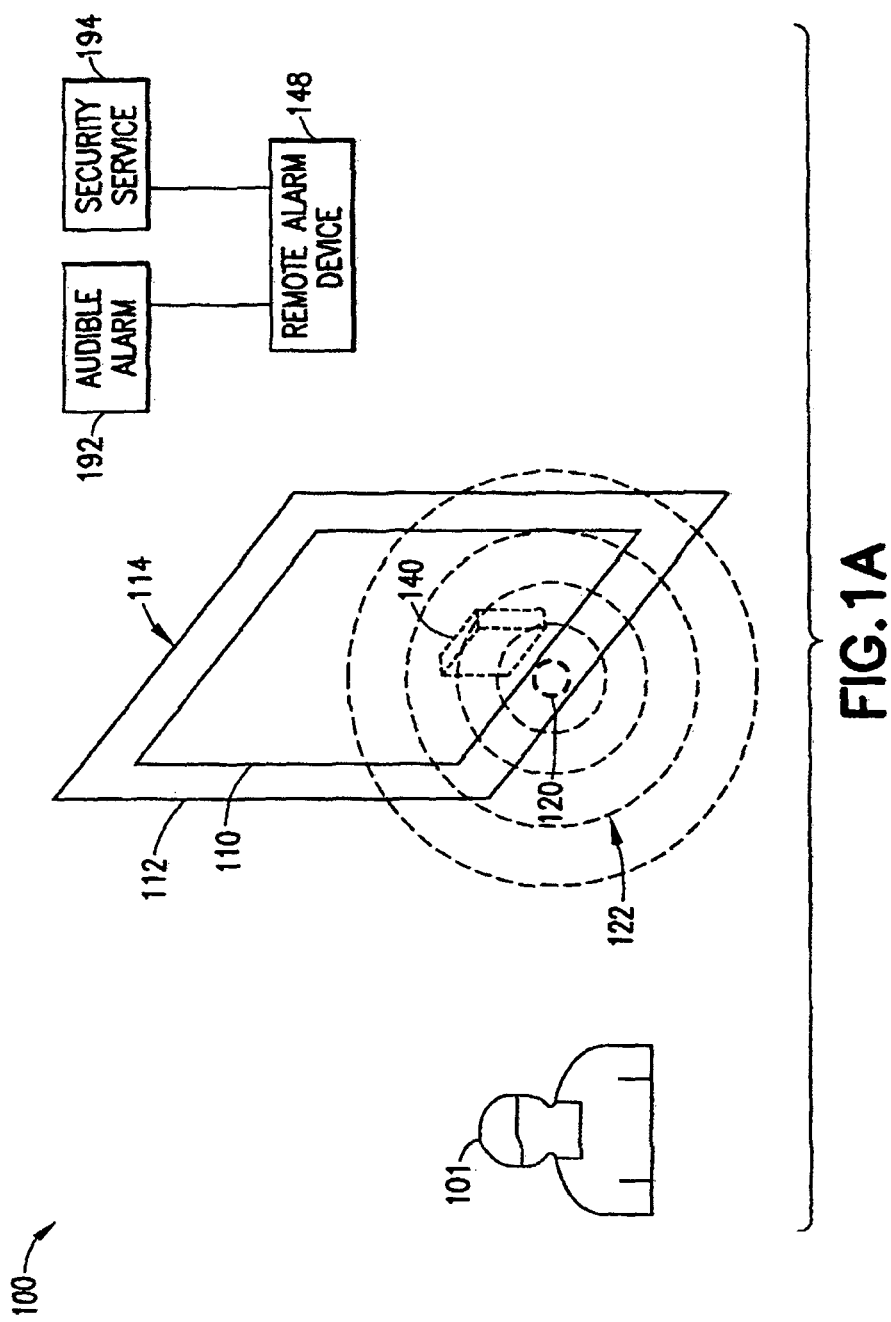
FIGS. 1A and 1B are schematic diagrams of an embodiment of a security system including a magnetic field source positionally-associated with a theft-susceptible movable object and a monitoring device mounted proximate to a selected location for the movable object.

The present disclosure relates to systems, devices, and methods for securing a theft-susceptible movable object at a selected location by generating a signal to warn of the movable object being moved. Specifically, a magnetic field source is attached to or otherwise positionally-associated with the movable object, and a monitoring device placed in proximity to the selected location detects alterations in measurements of the magnetic field that may result from movement of the movable object. Alternatively, a monitoring device may be positionally-associated with the movable object to detect alterations in measurements of a magnetic field generated by a magnetic field source positioned proximate to the selected location or a planetary magnetic field or other ambient magnetic field that would result from movement of the movable object and the associated monitoring device. Upon detecting alteration in the measurements of the magnetic field resulting from movement of the movable object, a warning signal is generated to warn that the movable object has been moved. When the monitoring device is positionally-associated with the movable object and configured to detect changes in measurements of an ambient magnetic field, the monitoring device also may include a motion sensing device such that, after movement of the movable object is detected by the motion sensor, the monitoring device then takes measurements of the ambient magnetic field to determine whether the movable object is moved from the selected location by more than a threshold amount.

In a particular aspect, the present disclosure relates to securing an artwork by generating a signal warning of movement of the artwork. As used herein, the term "artwork" refers to any of articles, objects, constructions and assemblies whose principal purpose is presentation or display, singly or as part of a collection or compilation, for evoking aesthetic or artistic perceptions when thus presented or displayed, including, without limitation: paintings; etchings; drawings; prints; posters; photographs; sculpture; tapestries; antiques; decorative and ornamental objects; cultural artifacts, historical artifacts, and articles such as books, precious or semiprecious stones, jewelry, toys, apparel, rugs, wines, coins, stamps, musical instruments, and the like, of a rare, historical, or vintage character, having a demonstrable commercial market as collectibles.

In another aspect, the disclosure relates to magnetic field-based security systems that utilize a magnet or another magnetic field source placed on, in, or near a movable object so as to positionally associate the magnet or magnetic field source with the movable object to be monitored by the security system. The magnet or magnetic field source is thus positioned in or near the structure or locus of the object to be monitored so as to be in an operative relationship with a magnetic or geomagnetic sensor arranged for magnetic field-based sensing of movement of the monitored article, structure, or locus, as further described hereinafter. Upon detecting movement of the monitored article, structure, or locus, an output correlative of such movement is responsively generated, as also further described hereinafter.

In another aspect, the disclosure relates to monitoring devices adapted to detect alterations in measurements of a magnetic field indicative of movement of a movable object from a selected location. The monitoring device may be placed proximate to the selected location to detect alterations in measurements of a magnetic field that are generated by a magnetic field source positionally-associated with the movable object. Alternatively, the monitoring device may be positionally-associated with the movable object and may be adapted to detect changes in a magnetic field associated with the selected location, where the magnetic field may be generated by magnetic field source placed proximate to the selected location or the magnetic field may be an ambient magnetic field, such as a planetary magnetic field. When the monitoring device is positionally-associated with the movable object, the monitoring device may include a motion detector, such as an accelerometer, to detect physical movement of the movable object; once the motion detector detects the physical movement, the monitoring device takes measurements of the magnetic field to determine if the movable object has moved from the selected location.

Figure 1B:
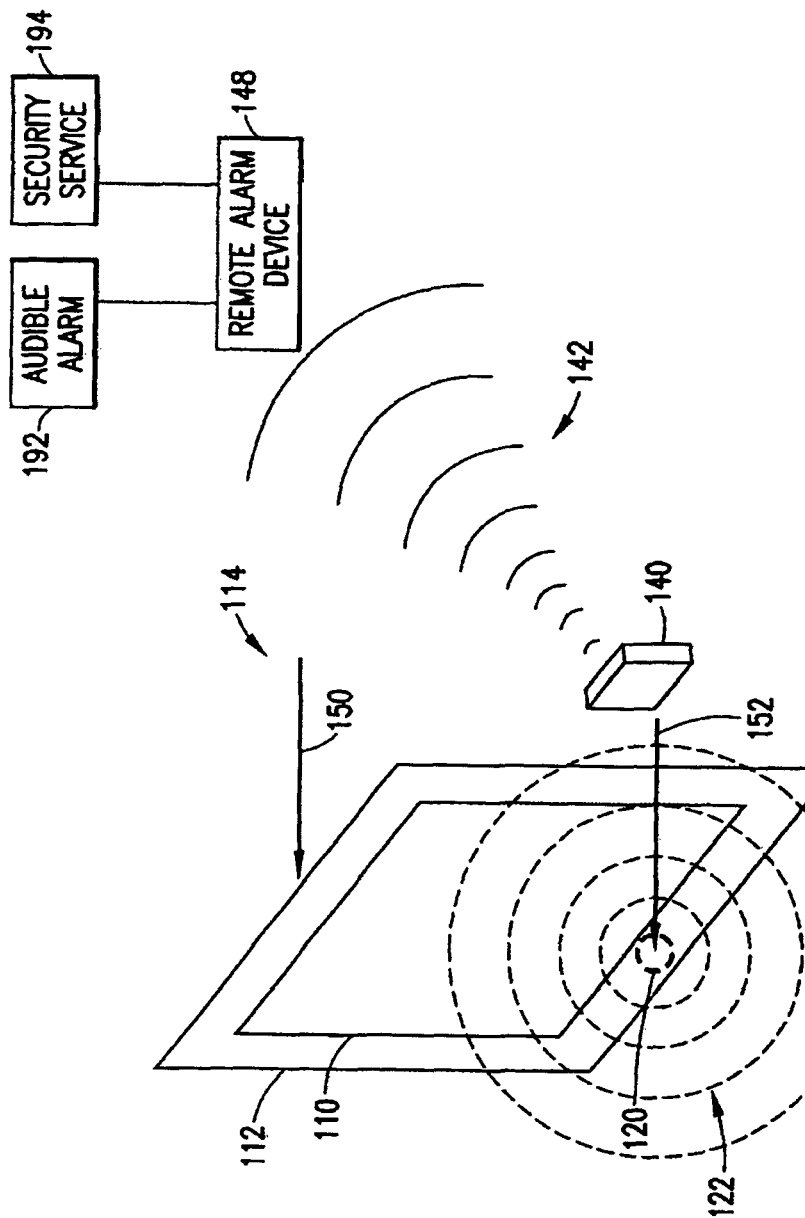

FIGS. 1A and 1B are schematic diagrams of an embodiment of a security system 100 including a magnetic field source 120 positionally-associated with a theft-susceptible movable object 110 and a monitoring device 140.

The magnetic field source 120 may include a magnet that may be any of many different types. For example, the magnet may include a ferromagnetic magnet, a ceramic of ferrite magnet, an alcino magnet, an injection-molded magnet, a flexible magnet, a rare-earth magnet, or any other type of magnet. For example, a rare-earth magnet may be desirable because rare-earth magnets generate a higher strength magnetic field than most other types of passive magnetic field sources. However, because of the relatively high cost of rare-earth magnets, it may be desirable to use other types of passive magnetic field sources. The type of magnetic field source 120, the sensitivity of devices used to measure the magnetic field, and the operating parameters of the system (e.g., how far from the magnetic field source 120 the monitoring device may be placed at the selected location) may be widely varied in the broad practice of the present disclosure, in specific implementations of the present disclosure.

In the illustrative example of FIGS. 1A and 1B, the theft-susceptible movable object is a painting. The painting 110 is mounted in a frame 112. The magnetic field source 120 is mounted to the frame 112. The magnetic field source 120 may be mounted by using adhesive, by using hardware, e.g., mechanical fasteners such as screws, staples, or nails, or by another manner of attachment, to affix the magnetic field source 120 to the frame 112. In a particular embodiment, the magnetic field source 130 is mounted to a back of the frame 112 where the magnetic field source 112 is not conspicuous or perhaps is not even visible to a person 101 who is viewing the painting 110.

The painting 110 and the frame 112 are mounted at a selected location 114, e.g., where the painting 110 and the frame 112 are hung on a wall. The magnetic field source 120 may include a passive magnetic source, such as a magnetic material that generates a magnetic field 122 without receiving electric power generated by a battery component or another electrical source. When protecting an artwork or another valuable object, it may not be desirable to install a battery-powered device on the object. Batteries may generate heat and/or may leak battery acid, either of which may be potentially damaging to the object. Thus, it may be undesirable to attach a battery-operated device or other powered device to the object. Further, it may be undesirable to move or otherwise handle the valuable object to replace the battery when needed, such as if the object is fragile, unwieldy, or heavy. Accordingly, use of a passive magnetic field source that does not require a power source may be advantageous.

A monitoring device 140 is positioned proximate to the painting 110, the movable object to be monitored, when the painting 110 is fixably positioned at the selected location 114. The monitoring device 140 may operate as a standalone device, or it may operate in concert with a remote alarm device 148. The remote alarm device 148 may be adapted to trigger an audible alarm 192 or to contact a security service 194 such as a public security service (e.g., the police) or a private security service. The remote alarm device 148 may be located on the premises where the painting is located or the remote alarm device 148 may be situated at another location where the remote alarm device 148 is in communication with the monitoring device 140.

The monitoring device 140 is adapted to monitor a magnetic field 122 generated by the magnetic field source 120. The monitoring device 140 is adapted to take measurements of a magnetic field 122 and to detect alterations of the magnetic field 122 that may be caused by movement of the magnetic field source 130 relative to the monitoring device 140. When the painting 110 in the frame 112 is fixably positioned at the selected location 114, measurements taken by the monitoring device 140 of the magnetic field 122 generated by the magnetic field source 130 should be stable. Further, as long as the painting 110 in the frame 112 remains fixably positioned at the selected location 114, the measurements of the magnetic field 122 taken by the monitoring device 140 generally will not change.

Movement of the painting 110 in the frame 112 may be undesirable. For example, movement of the painting 110 in the frame 112 may signal that the painting is being undesirably handled, is being stolen, or otherwise is being undesirably moved. Thus, an object of the security system 100 using the magnetic field source 120 and the monitoring device 140 is to generate a signal upon detecting movement of the painting 110 in the frame 112.

As shown in FIG. 1B, when the painting 110 in the frame 112 is moved a distance 150 from the selected location, the magnetic field source 120 is moved a distance 152 from the monitoring device 140. As a result of the movement of the painting in relation to the monitoring device 140, the strength of the magnetic field 122 as measured by the monitoring device 140 changes. The monitoring device 140 detects the alteration in the measurements of the magnetic field 122. In response, the monitoring device 140 generates an electronic warning signal 142. The electronic warning signal 142 may include a signal that is sent to the remote alarm device 148, either via a wired or a wireless connection, as further described hereinafter with reference to FIG. 7. The remote alarm device 148 thus may trigger an audible alarm 192 or trigger an alert to a security service 194. Alternatively, the electronic warning signal 142 may include an audible alarm signal that is sounded to call attention to potentially undesirable movement of the painting 110 in the frame 112.

The monitoring device 140 may be configured to take multiple measurements of the magnetic field 122 and to average the measurements so that the security system 100 does not generate false alarm signals that otherwise may be caused by small, transient changes in the measurements of the magnetic field 122. Such changes in the measurements of the magnetic field 122 may be caused by electromagnetic surges or the presence of other magnetic field sources in the vicinity of the monitoring device 140.

FIGS. 2A and 2B are schematic diagrams of an artwork, such as the painting 110 in the frame 112 of FIGS. 1A-1B, adapted for hanging on a wall 210. As described with reference to FIGS. 1A-1B, the painting 110 in the frame 112 is hung at the selected location 114. As described with reference to FIGS. 1A-1B, the magnetic field source 120 is affixed to the frame 112 of the painting 110. The monitoring device 140 is mounted behind the painting 112 on a front surface 212 of the wall 210. Depending on amount of room behind the painting 110 in the frame 112 and the dimensions of the monitoring device 140, the monitoring device 140 may be mounted to the front surface 212 of the wall 210 yet be concealed behind the painting 110 so that the monitoring device 140 is not visible or conspicuous to a person viewing the painting, as described with reference to FIGS. 1A-1B.

In a particular embodiment, the monitoring device 140 is sensitive to a magnetic field (not shown in FIG. 2) generated by the passive magnetic field source 120 mounted on the frame 112. In a specific arrangement, to be responsive to a magnetic field generated by a passive magnetic field source 120, the monitoring device 140 is positioned within an operating range 215, e.g., of 15 centimeters.

FIG. 2B is a schematic diagram of an artwork, such as the painting 110 in the frame 112, adapted for hanging on a wall, including alternative embodiments for the configuration of a magnetic field source 220 and the monitoring device 140, 242, and 244. Because the magnetic field source 220 may include a passive magnetic field source that is not electrically powered, the passive magnetic field source may not generate heat or present a risk of a leak of caustic chemicals that may damage a valuable object. Thus, instead of attaching a magnetic field source 120 to the frame 112 of the painting 110 as shown in FIGS. 1A and 2A, the magnetic field source 220 may be positionally-associated with the painting 110 by affixing the magnetic field source directly to the painting 110, as shown in FIG. 2B.

Additionally, it may not be practical or desirable to mount the monitoring device 140 on the front surface 212 of the wall 210. For example, the painting 110 may be mounted without a frame 112 or may be mounted in a shallow frame that does not allow the mounting device 140 to be mounted behind the painting 110. Similarly, it may be desirable not to dispose the monitoring device 140 as close to the back of the painting 110 as would result if the mounting device 140 were mounted on the front surface 212 of the wall 210. Thus, a monitoring device may be mounted in a recess within the surface of the wall 214, e.g., as shown for monitoring device 242 in FIG. 2B. Similarly, a monitoring device may be mounted on back surface 216 of the wall 210, e.g., as shown for monitoring device 244 in FIG. 2B. Because the monitoring device may be responsive to changes in the magnetic field generated by the magnetic field source 220 when the monitoring device 140, 242, or 244 is within a specific operating range of the magnetic field source 220 (e.g., 15 centimeters, in a particular embodiment, as described with reference to FIG. 2A), there is flexibility in where the monitoring device 140, 242, or 244 may be mounted.

Embodiments of the security system are not limited for use with objects adapted to hang on a wall, as described with reference to FIGS. 1A, 1B, 2A, and 2B. Embodiments of the security system also may be used to monitor for movement of objects adapted to rest on a surface, such as described with reference to FIGS. 3A and 3B.

FIG. 3A is a schematic diagram of a valuable object, such as a sculpture 310. It should be noted that the valuable object may include an artwork, such as the sculpture 310 of FIGS. 3A and 3B. However, embodiments of the present disclosure may be used to protect any objects to which a person attributes value, whether the value is aesthetic value, commercial value, sentimental value, or other form of value. The protected object may for example include a cherished family souvenir or heirloom. The protected object may include a valuable electronic device, such as a computer, computer component, or a valued audio or video component. Embodiments of the present disclosure thus may be used to protect any movable object regardless of the nature or source of its value.

Referring again to FIG. 3A, the sculpture 310 is adapted to rest upon a supporting surface, such as an upper surface 314 of a table or pedestal 312. A magnetic field source 320 is directly attached to the sculpture 310, such as by an adhesive or other fixative or fixation arrangement (not shown). A monitoring device 340 is responsive to changes in a magnetic field generated by the magnetic field source 320. To keep the monitoring device 340 out of sight, so as not to detract from the aesthetics of the sculpture 340, the monitoring device 340 may be mounted on an underside 318 of the pedestal 312. As previously described, in a particular embodiment, the monitoring device 340 may be responsive to the magnetic field generated by the magnetic field source 320 within a particular operating range (e.g., 15 centimeters, in a particular embodiment, as described with reference to FIGS. 2A and 2B). Accordingly, the monitoring device 340 may be mounted in an inconspicuous location, such as the underside 318 of the pedestal 312, even when the sculpture 310 rests on the upper surface 314 of the pedestal 312.

Alternatively, as shown in FIG. 3B, the sculpture 310 may rest on a base 350 attached to the sculpture 310 that rests on the top surface 314 of the pedestal 312. When the sculpture 310 is mounted on the base 350, a magnetic field source 322 may be positionally-associated with the sculpture 310 by mounting the magnetic field source 322 on or in the base 350 instead of directly on the sculpture 310. If the sculpture 310 is moved, the base 350 on which it is mounted will also move, which will result in the magnetic field source 322 moving relative to a monitoring device mounted on the pedestal 312.

As previously described, in a particular embodiment, the monitoring device may be anywhere within 15 centimeters of the magnetic field source 322. Thus, the monitoring device may be mounted on an underside 318 of the pedestal 312, as the monitoring device 340 is placed on the underside 318 of the pedestal 312 as shown in FIGS. 3A and 3B. Alternatively, the monitoring device may be placed in a recess 316 within the pedestal 312, such as the monitoring device 342 of FIG. 3B. Further alternatively, if there is sufficient space beneath the sculpture 310 or the base 350 to which the sculpture 310 is attached and on which the sculpture 310 rests, a monitoring device may be placed on the top surface 314 of the pedestal 312 beneath the sculpture 310 or the base 350, such as the monitoring device 344 as shown in FIG. 3B.

In a particular embodiment, such as described with reference to FIGS. 1A-3B, it may be desirable to positionally-associate a magnetic field source with a movable object and to place a monitoring device in a location proximate to a selected location where the movable object is to be displayed or used. Alternatively, it may be desirable to positionally-associate the monitoring device with the movable object and to place the magnetic field source in a location proximate to the selected location where the movable object is to be displayed or used. This alternative is further described with reference to FIGS. 4A-6B.

Figure 4B:
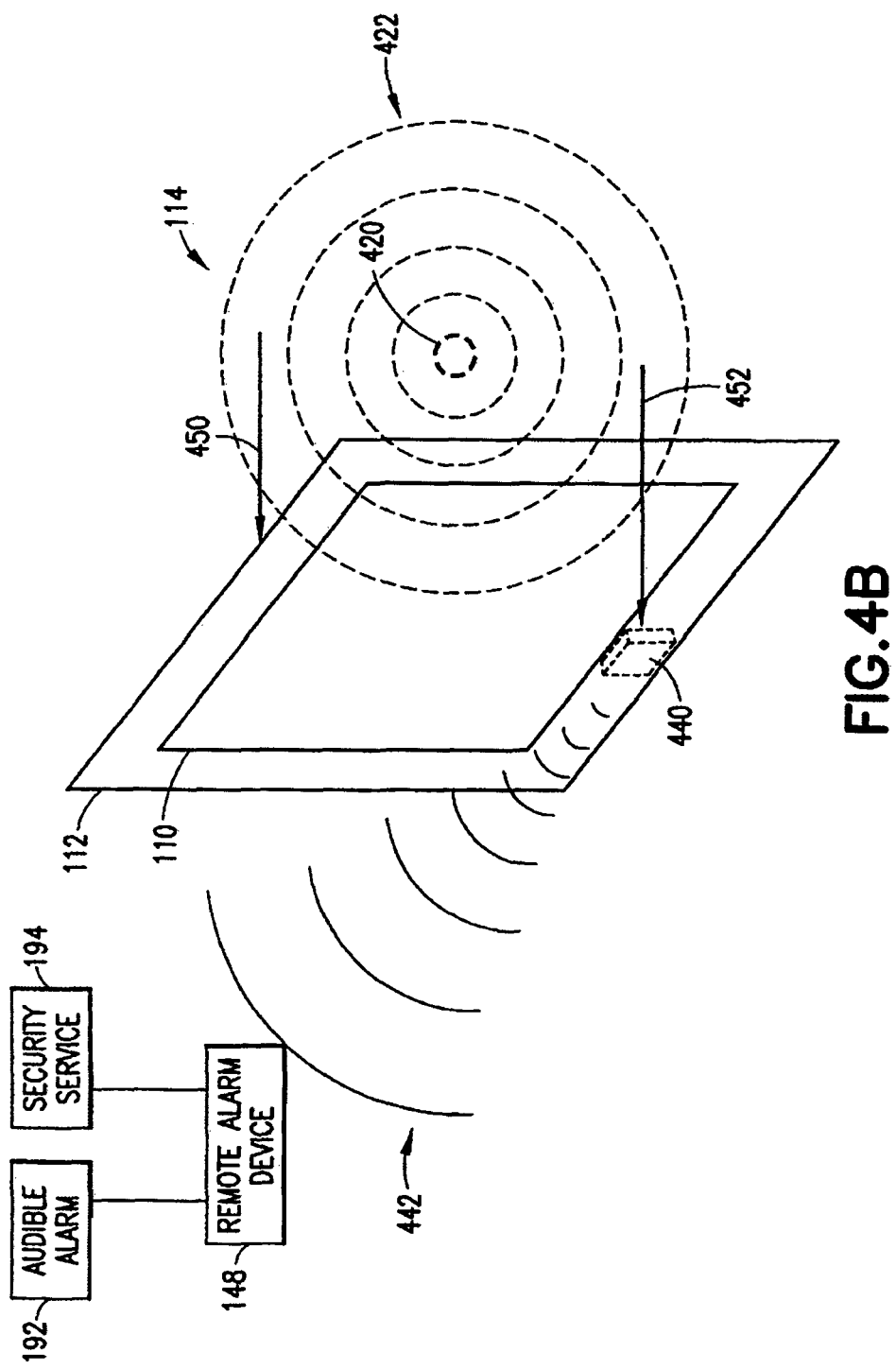

FIGS. 4A and 4B are schematic diagrams of an embodiment of a security system 400 including a monitoring device 440 positionally-associated with a theft-susceptible movable object 110 and a magnetic field source 420. As in the example of FIGS. 1A and 1B, the example of the theft-susceptible movable object of FIGS. 4A and 4B is the painting 110. The painting 110 is mounted in the frame 112. The monitoring device 440 is mounted to the frame 112. The monitoring device 440 may be mounted on the painting 110 or the frame 112 by using adhesive, by using hardware, e.g., mechanical fasteners such as screws, staples, or nails, or by other manner of attachment to affix the monitoring device 440 to the frame 112. In a particular embodiment, the monitoring device 440 is mounted to a back of the frame 112 where the monitoring device 440 is not conspicuous or perhaps is not even visible to a person 101 that is viewing the painting 110.

The painting 110 and the frame 112 are mounted at the selected location 114, as described with reference to FIGS. 1A and 1B, where the painting 110 and the frame 112 are hung on a wall. Proximate to the selected location 114, a magnetic field source 430 is positioned. The magnetic field source 420 may include a passive magnetic source, such as a magnetic material that generates a magnetic field 422 without receiving electric power generated by a battery component or other electrical source. Alternatively, the magnetic field source 420 may include an electromagnet that is powered by a battery or by a power line (not shown in FIG. 4A or 4B). The magnetic field source 420 is positioned proximate to the painting 110, the movable object to be monitored, when the painting 110 is fixably positioned at the selected location 114.

The monitoring device 440 may operate as a stand-alone device, or it may operate cooperatively with a remote alarm device 148, as described with reference to FIGS. 1A and 1B. The remote alarm device 148 may be adapted to trigger an audible alarm 192 or to contact a security service 194 such as a public security service (e.g., the police) or a private security service. The remote alarm device 148 may be located on the premises where the painting is located, or the remote alarm device 148 may be situated at another location where the remote alarm device 148 is in communication with the monitoring device 440.

The monitoring device 440 is adapted to monitor a magnetic field 422 generated by the magnetic field source 420. The monitoring device 440 may take measurements of the magnetic field 422 so as detect alterations or changes in the magnetic field 422 such as may be caused by movement of the monitoring device 440 relative to the magnetic field source 420. When the painting 110 and the frame 112 are fixedly positioned at the selected location 114, the measurements of the magnetic field 422 generated by the magnetic field source 430 generally remain consistent. Generally, as long as the painting 110 and the frame 112 remain fixedly positioned at the selected location 114, the monitoring device 440 detects no change in the magnetic field 422. A magnetic field generated by a passive magnetic field source 420, however, may be of low strength. Accordingly, the monitoring device 440 should include a correspondingly sensitive magnetic field detector, such as a compass sensor, as further described with reference to FIG. 7.

Movement of the painting 110 and the frame 112 may be undesirable. For example, movement of the painting 110 and the frame 112 may signal that the painting is being undesirably handled, is being stolen, or otherwise is being undesirably moved. Thus, an objective of the security system 400 using the magnetic field source 420 and the monitoring device 440 is to generate an alarm upon detecting movement of the painting 110 and the frame 112.

As shown in FIG. 4B, when the painting 110 and the frame 112 are moved a distance 450 from the selected location, the monitoring device 440 is moved a distance 452 from the magnetic field source 420. As a result of the movement of the painting, from the perspective of the monitoring device 440, measurements of the magnetic field 422 of FIG. 4A will correspondingly change. As a result of the changes in the measurements of the magnetic field 422, the monitoring device 440 responsively generates an electronic warning signal 442. The electronic warning signal 442 may include a signal that is sent to the remote alarm device 148, for example, via a wireless connection, as further described below with reference to FIG. 7. The remote alarm device 148 thus may trigger an audible alarm 192 and/or trigger an alert to a security service 194. Alternatively, the electronic warning signal 442 may include an audible alarm signal that is sounded to call attention to potentially undesirable movement of the painting 110 and the frame 112.

As similarly described with reference to the monitoring device 140 of FIG. 1B, the monitoring device 440 may be configured to take multiple measurements of the magnetic field 420 and to average the measurements so that the security system 400 does not generate false alarm signals that otherwise may be caused by small, transient changes in the measurements of the magnetic field 422. Such changes in the measurements of the magnetic field 422 may be caused by electromagnetic surges or the presence of other magnetic field sources in the vicinity of the monitoring device 440.

Figure 5B:
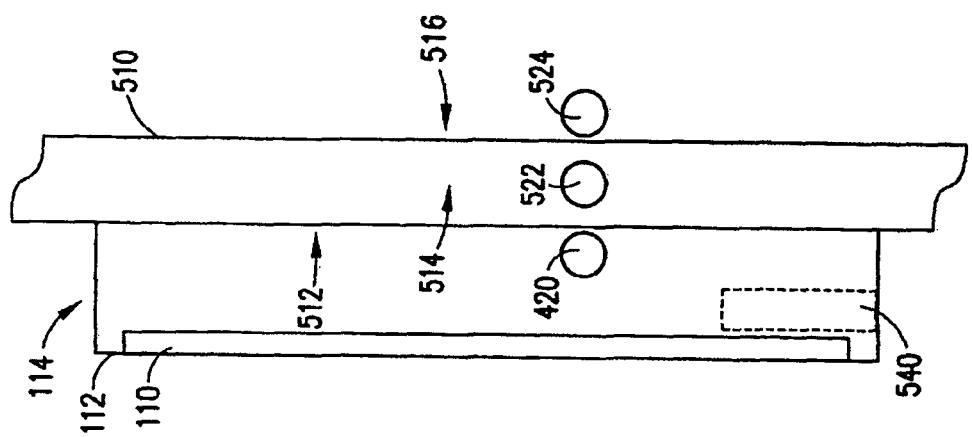
FIGS. 5A and 5B are schematic diagrams of an artwork adapted for hanging on a wall including embodiments of a monitoring device affixed to a frame of the artwork or the artwork itself, and a magnetic field source mounted to a surface of the wall behind the object, within the wall, and behind the wall.
Figure 5A:
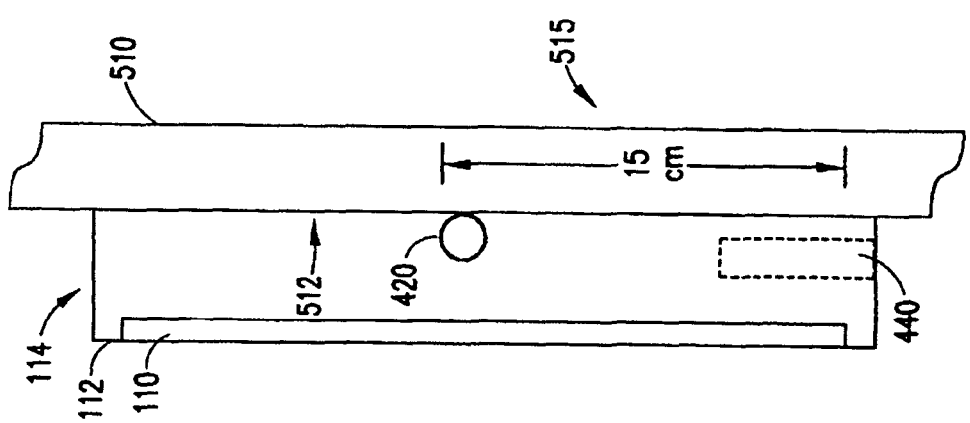

FIGS. 5A and 5B are schematic diagrams of an artwork, such as the painting 110 in the frame 112 of FIGS. 4A-4B, adapted for hanging on a wall 510. As described with reference to FIGS. 4A-4B, the painting 110 in the frame 112 is hung at the selected location 114. As described with reference to FIGS. 4A-4B the monitoring device 440 is affixed to the frame 112 of the painting 110. The magnetic field source 420 is mounted behind the painting 112 on a front surface 512 of the wall 510. The magnetic field source 420 may be mounted to the front surface 512 of the wall 510 yet be concealed behind the painting 110 so that the magnetic field source will not be visible or conspicuous to a person viewing the painting, as described with reference to FIGS. 4A-4B. In a particular embodiment, as previously described, to be responsive to a magnetic field (not shown in FIG. 5A) generated by a passive magnetic field source 420, the monitoring device 440 should be positioned within an appropriate operating range 515, e.g., 15 centimeters.

FIG. 5B is a schematic diagram of an artwork, such as the painting 110 in the frame 112, adapted for hanging on a wall including alternative embodiments for the configuration of a monitoring device 442 and the magnetic field source 420, 522, and 524. Instead of attaching a monitoring device 440 to the frame 112 of the painting 110 as shown in FIG. 5A, the monitoring device may 442 be positionally-associated with the painting 110 by affixing the monitoring device 442 directly to the painting 110, as shown in FIG. 5B. Additionally, instead of mounting the magnetic field source 420 on the front surface 512 of the wall 510, as shown in FIG. 5A, a magnetic field source 522 may be mounted in a recess 514 within the surface of the wall 510, or a magnetic field source 524 may be mounted on a back surface 516 of the wall 510, as shown in FIG. 5B. It is within the contemplation of the present disclosure to employ multiple magnetic field sources in particular implementations, as well as multiple monitoring devices, in specific embodiments. As previously described, because the monitoring device 440 or 540 is adapted to be responsive to changes in the magnetic field generated by the magnetic field source 420, 522, or 524, the monitoring device 440 or 540 should be mounted within an operating range 515 of the magnetic field source 420, 522, or 524 (e.g., 15 centimeters, in a particular embodiment, such as is described with reference to FIG. 2A). In any event, there is flexibility in where the monitoring device 440 or 540 and the magnetic field source 420, 522, or 524 may be mounted.

As previously described with reference to FIGS. 3A and 3B, embodiments of the security system are not limited for use with objects adapted to hang on a wall. FIG. 6A shows a security system in use with a theft-susceptible movable object 610 other than a sculpture 310, as shown in FIGS. 3A and 3B. The movable object may be an electronic component or device, an antique object, a piece of fine pottery, a cultural artifact, an historical artifact, a valued heirloom, or some other movable object determined to be worthy of protection.

Referring again to FIG. 6A, the movable object 610 is adapted to rest upon a supporting surface, such as an upper surface 614 of a table or pedestal 612. A monitoring device 640 is directly attached to the movable object 610, such as by an adhesive or other fixation material or arrangement (not shown). The monitoring device 640 is responsive to changes in a magnetic field generated by a magnetic field source 630.

The magnetic field source 630 may be mounted on an underside 618 of the pedestal 612. As previously described, in a particular embodiment, the monitoring device 640 may be responsive to the magnetic field generated by the magnetic field source 630 within a particular operating range (e.g., 15 centimeters, in a particular embodiment, as described with reference to FIGS. 2A and 5A). The monitoring device 640 may be mounted in an inconspicuous location, such as the underside 618 of the pedestal 612, even when the movable object 610 rests on the upper surface 614 of the pedestal 612.

Figure 6B:
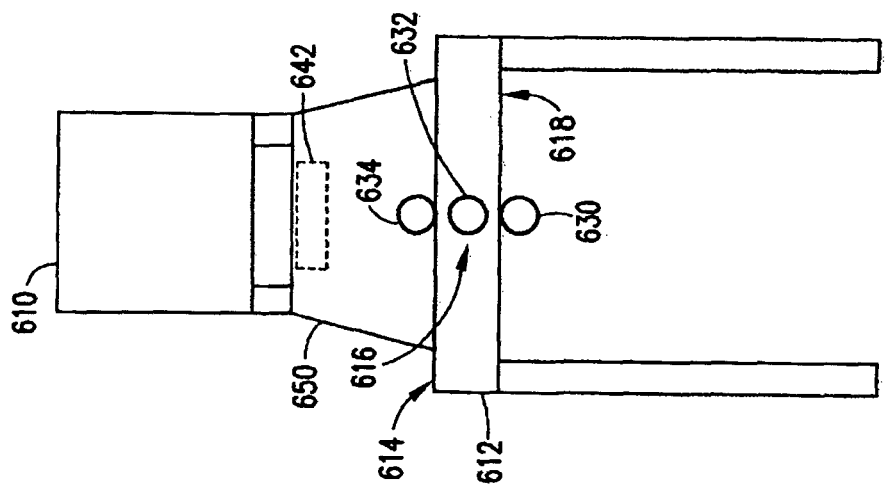
FIGS. 6A and 6B are schematic diagrams of movable object adapted to rest upon a supporting surface including embodiments of a monitoring device affixed directly to the movable object or to a base coupled to the artwork, and a magnetic field source positioned beneath the artwork atop the supporting surface, within the supporting surface, and beneath the supporting surface.
Figure 6A:
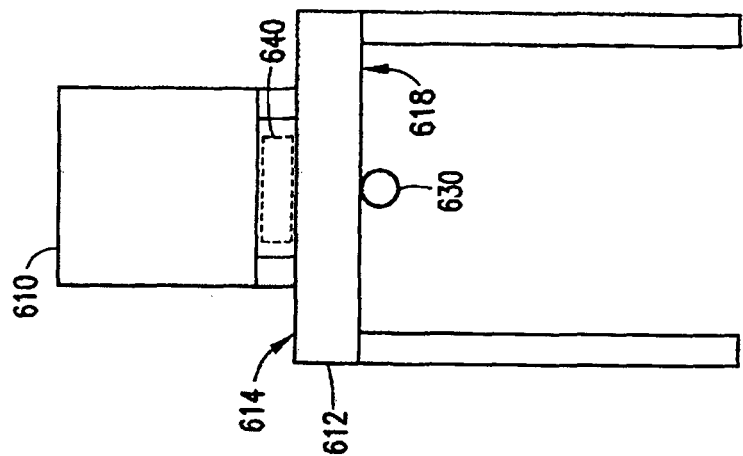

Alternatively, as shown in FIG. 6B, the movable object 610 may rest on a base 650 attached to the movable object 610 that rests on the top surface 614 of the pedestal 612. When the movable object is mounted on the base 650, a monitoring device 642 may be positionally-associated with the movable object 610 by mounting the monitoring device 642 on the base 650 instead of directly on the movable object 610. If the movable object 610 is moved, presumably the base 650 will also move, which will result in the monitoring device 642 moving relative to a magnetic field source 630, 632, or 634 mounted on the pedestal 312.

As previously described, in a particular embodiment, the magnetic field source 630, 632, or 634 may be located anywhere within an operating range (e.g., 15 centimeters) of the monitoring device 642. Thus, the monitoring device 630 may be mounted on an underside 618 of the pedestal 612. Alternatively, a monitoring device 632 may be placed in a recess 616 within the pedestal 612. Further alternatively, if there is sufficient space beneath the movable object 610 or the base 650 to which the movable object 610 is attached and on which the movable object 610 rests, a magnetic field source 634 may be placed on the top surface 614 of the pedestal 612 beneath the movable object 610 or the base 650.

Figure 7B:
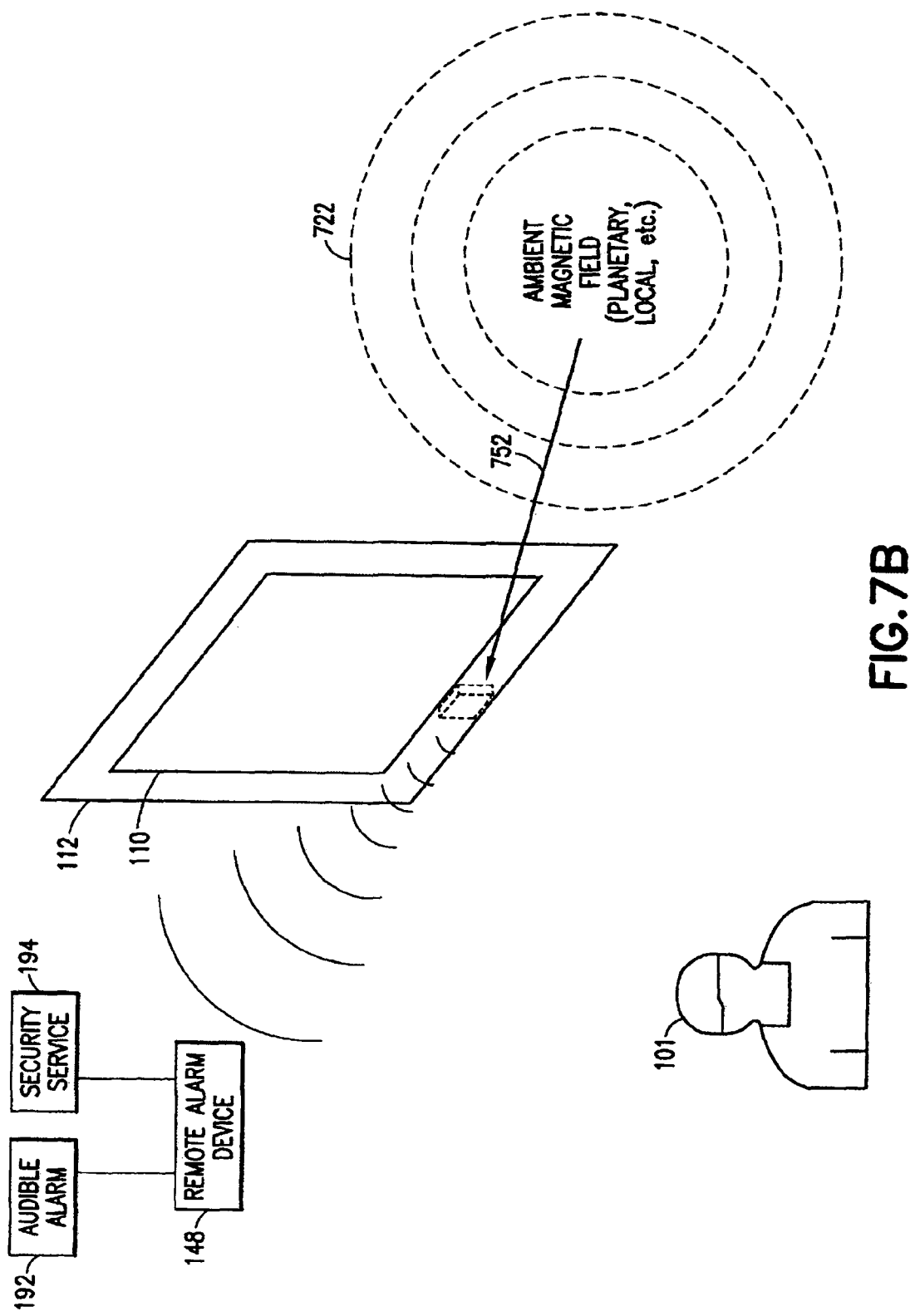

FIGS. 7A and 7B are schematic diagrams showing an embodiment of a monitoring device 740 positionally-associated with a movable object, such as an artwork 110 mounted in a frame 112, as previously described with reference to FIGS. 1A, 1B, 4A, and 4B. The monitoring device 740 is adapted to detect alterations in measurements of an ambient magnetic field 722 indicative of movement of the movable object from the selected location 114 where the artwork 110 is displayed. As described with reference to FIGS. 4A and 4B, the monitoring device 440 monitors a magnetic field 422 generated by a magnetic field source 420 placed proximate to the selected location 114; analogously, the monitoring device 740 monitors the ambient magnetic field 722 predominantly comprised of a planetary magnetic field. In addition to the planetary magnetic field, the ambient magnetic field 722 may also include magnetic field components generated by local metallic or magnetic structures and local electromagnetic energy sources.

When the artwork 110 is moved from the selected location 114, the monitoring device 740 detects the alteration of measurements in the ambient magnetic field 722 resulting from the artwork 110 being moved. Using a commercially available solid-state compass sensor as a magnetic sensor, movement of the artwork 110 and the positionally-associated monitoring device over a modest distance 752 will result in an alteration of measurements of the ambient magnetic field 722. Upon detecting the alteration in the measurements of the ambient magnetic field 722, the monitoring device 740 generates a signal indicating the artwork 110 has been moved.

As further described with reference to FIG. 8, an embodiment of a monitoring device 740 may include a motion sensor, such as an accelerometer. The motion sensor can be of a type that is adapted to detect minute vibrations or other motions of the monitoring device 740 and the movable object 110 with which it is positionally-associated. In such an embodiment, upon the motion sensor identifying movement of the monitoring device, the monitoring device 740 may then take measurements of the ambient magnetic field 722, such that alterations in the measurements of the magnetic field 722 may indicate that the artwork 110 and the monitoring device 720 have moved from the selected location 114.

Figure 8:
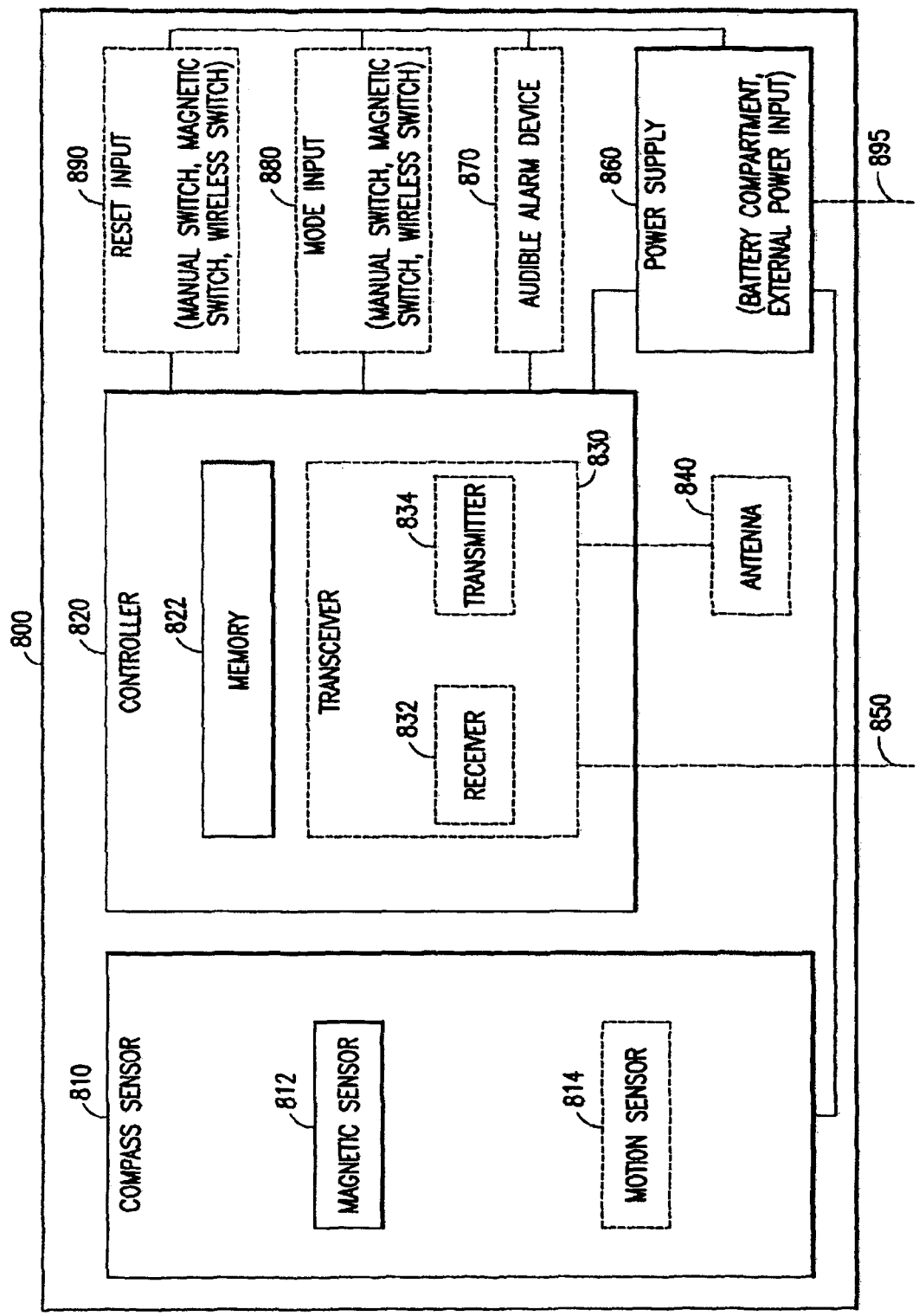
FIG. 8 is a block diagram of an embodiment of a monitoring device adapted for detecting alterations of measurements of a magnetic field.

FIG. 8 is a block diagram of an embodiment of a monitoring device 800 adapted for detecting alterations of measurements of a magnetic field, such as the motion detectors 140, 440, and 740, such as previously described with reference to FIGS. 1A-1B, 4A-4B, and 7A-7B, respectively. The monitoring device 800 includes a compass sensor 810, which may include a magnetic sensor 812 and a motion sensor 814. The compass sensor 810 is operably coupled to a controller 820, which includes memory or storage 822, and may include a transceiver 830, which may include a receiver 832 and/or a transmitter 834. When the controller 820 includes a receiver 832 and a transmitter 834, the receive 832 and the transmitter 834 may be coupled to an antenna, for wireless communications, or to a communications line 850 for wired communications. The monitoring device 800 may also receive power from a power supply 860 coupled to provide electrical power to the compass sensor 810 and the controller 820. In addition, the monitoring device 800 also may include an audible alarm device 870, a mode input 800, and a reset input 890, as further described below. Similar to the compass sensor 810 and the controller 820, the other devices may draw electrical power from the power supply 860, as necessary or desirable in a given implementation of the disclosure.

In one implementation, the compass sensor 810 of the monitoring device 800 may include a LSM303DLHC Ultra compact high performance e-compass 3D accelerometer and 3D magnetometer module commercially available from ST Microelectronics of Geneva, Switzerland, which includes both a magnetic sensor 812 and a motion sensor 814. The controller may include a Si1010 Wireless Microcontroller produced by Silicon Labs of Austin, Tex. The controller 820 includes memory 822 and an integrated transceiver 830 to support wireless communications, and is electrically programmable with instructions to perform intended functions. The LSM303DLHC compass module and the Si1010 Wireless Microcontroller may communicate with each other using a standard inter-integrated circuit ("I$^2$C") two-wire bus that each device supports.

When the monitoring device 800 is to be positionally-associated with the movable object, the power supply 860 will generally include a battery pack or battery compartment configured to receive one or more batteries. The battery pack may be physically incorporated within the monitoring device 800 or the power supply 860 may include an external battery pack configured to be electrically connected to the monitoring device 800. Further, alternatively, when the monitoring device 800 is configured to be placed at a stationary location proximate to the selected location of the movable object, the monitoring device may be configured to receive an external power input from household current source, or another external power source.

A particular embodiment of the monitoring device 800 may be configured to function as the monitoring device 140 of FIGS. 1A-1B or the monitoring device 440 of FIGS. 4A-4B. At first intervals, the controller 820 may send an activation or wake-up signal to the compass sensor 810 to cause the compass sensor 810 to take one or more magnetic readings to determine whether the relative position of the magnetic sensor and the magnetic field source have changed, indicating movement of the movable object away from its selected location. In other words, the controller 820 may cause the compass sensor 810 to take measurements to determine whether a magnetic field source 120 positionally-associated with the movable object 110 has moved away from the stationary monitoring device 140, as described with reference to FIGS. 1A-1B. The controller 820 may also cause the compass sensor 810 to take measurements to determine whether a monitoring device 440 positionally-associated with the movable object 110 has moved away from a stationary magnetic field source 420.

In a particular configuration, the controller 820 is programmed to trigger the compass sensor 810 to take measurements of the magnetic field every two seconds. Such interval saves power as compared to continually taking measurements of the magnetic field. When the power supply 860 includes a battery pack, the life of the batteries thus may be greatly prolonged, to reduce battery cost and extend the time between required battery replacements. At the same time, taking measurements every two seconds is sufficient to monitor the movable object, because very little relative movement of the movable object can occur between two second intervals.

When measurements are taken, one or more measurements may be taken, stored in the memory 822 of the controller 820, and then averaged to determine a measurement for a particular interval. When the controller 820 detects a change or alteration in the measurements of the magnetic field taken by the compass sensor 810, the alteration may be compared to a programmed threshold differential that may be set to represent a degree in change of the measurements that signifies that the movable object actually has moved. When the alteration in measurements does signify movement of the movable object, the controller 820 generates a signal. The signal may be used to cause the transceiver 830 (in particular, the transmitter 834) to transmit a signal via the antenna 840 or the communication line to an alarm system, as described with reference to FIGS. 1A-1B and 4A-4B, to thereby call attention to the movement of the movable object. Alternatively, or additionally, the controller 820 may present the signal to the audible alarm device 870 to generate an audible alarm to call attention to movement of the movable object.

In another specific embodiment, the monitoring device 800 may be configured to function as the monitoring device 740 of FIGS. 7A-7B. At first intervals, the controller 820 may send an activation or wake-up signal to the compass sensor 810 to cause the compass sensor 810 to take one or more magnetic readings of an ambient magnetic field 722 to determine whether the movable object—and the monitoring device positionally-associated with the movable object—has moved relative to the ambient magnetic field 722.

In another embodiment, the controller 820 may be configured to respond to a signal from the motion sensor 814 that may detect vibrations or other small movements of the movable object to then cause the magnetic sensor 812 to determine whether the monitoring device and the movable object with which it is positionally-associated has moved relative to the ambient magnetic field.

When movement of the movable object is detected, as previously described, the controller 820 will cause the transceiver 834 to send a signal to a remote alarm system and/or to use the audible alarm device 870 to generate an audible alarm.

In order to determine whether there has been a change or alteration in measurements of a magnetic field, a baseline magnetic reading may be taken to provide a basis of comparison for the subsequent measurements. The baseline magnetic reading may be taken upon power-up or reset of the monitoring device. In one implementation, upon power-up or reset, multiple measurements may be taken at intervals, which may be shorter in duration than the every-two-second intervals previously described for determining whether the movable object has moved. The measurements taken may be stored in the memory 822 of the controller 820 and then averaged to determine the baseline magnetic reading which, too, may be stored in the memory 822 of the controller 820. In some embodiments, updated baseline magnetic readings may be taken at subsequent selected or otherwise predetermined intervals.

It may be desirable for the baseline magnetic reading to be established automatically upon activation of the monitoring device and/or upon subsequent intervals. Alternatively, it may be desirable to enable manual reset of the monitoring device, or to enable either automatic or manual reset of the monitoring device. The monitoring device 800 may be configured upon manufacture to be either automatically or manually resettable. Alternatively, the monitoring device may include the manual mode input 880 to enable the reset mode to be controlled by a manual switch, by a switchable jumper block, or by receipt of a wireless signal or a magnetic signal, such as further described with reference to FIG. 9. When the monitoring device provides manual reset, the monitoring device 800 may include the reset input 880. The manual reset may also be triggered by a manual switch, by a switchable jumper block, or by receipt of a wireless signal or a magnetic signal, such as further described with reference to FIG. 9. It should be appreciated that, when the mode input or the mode reset operates according to a wireless signal, the transceiver 830 of the controller 820 may serve to receive mode signals or reset signals.

Figure 9A:
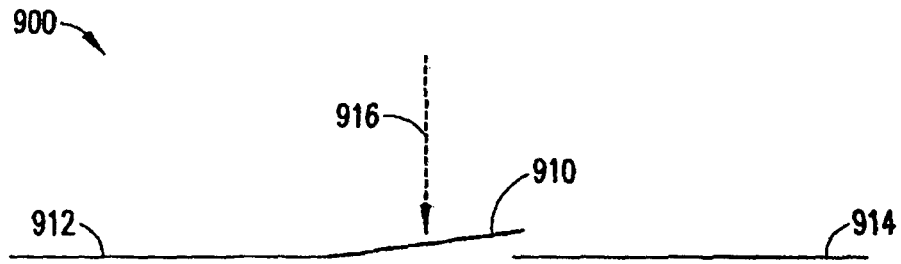
FIGS. 9A, 9B, and 9C are schematic diagrams of switching devices that may be used to set a reset mode of the monitoring device or to reset the monitoring device to initiate the taking of the baseline reading of the magnetic field to be used as a basis of comparison in detecting alterations in measurements of the magnetic field.
Figure 9B:
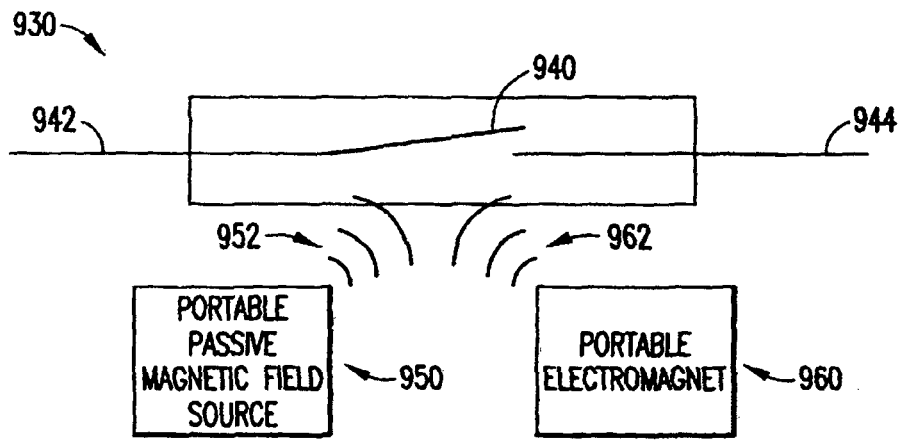
Figure 9C:
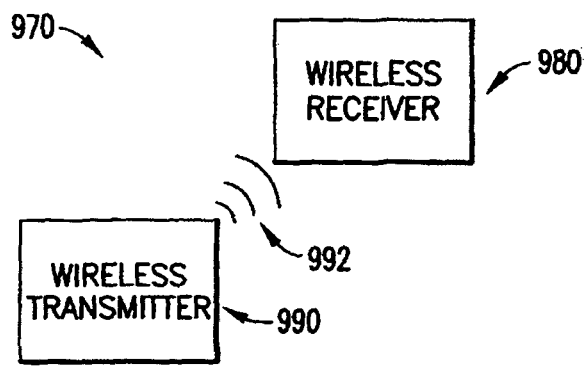

FIGS. 9A, 9B, and 9C are schematic diagrams of switching devices that may be used to set a reset mode of the monitoring device or to reset the monitoring device to initiate the taking of the baseline reading of the magnetic field to be used as a basis of comparison in detecting alterations in measurements of the magnetic field.

FIG. 9A shows a manual switch 900 that may be used to set the reset mode or to initiate a reset. The manual switch 900 includes a movable member 910 that may be moved to close a connection between a first lead 912 and a second lead 914 when a manual actuator 916 is used to move the movable member 910 into a closed position. The manual switch 910 may be desirable to set the reset mode upon installing the monitoring device either upon a movable object or when the monitoring device will be positioned at a stationary location. The manual switch 910 may be an acceptable choice to trigger a reset when the monitoring device is installed at a location where the monitoring device may be easily accessed. Thus, for example, when the monitoring device is to be placed underneath or behind a painting or underneath a sculpture where the monitoring device cannot be reached without moving the painting or sculpture, another type of reset switch may be desirable.

FIG. 9B shows a magnetic switch 930 that may be used to set the reset mode or to initiate a reset. For example, the magnetic switch may include a reed switch. The magnetic switch 930 includes a magnetically-movable member 940 that may be moved to close a connection between a first lead 942 and a second lead 944 when a magnetic field is applied to draw the magnetically-movable member 940 into a closed position. A magnetic field may be applied by a portable passive magnetic field source 950, such as a basic magnet, that generates a magnetic field 952 capable of actuating the magnetically-movable member 940. A magnetic field may be applied by a portable electromagnet 960 that, upon being supplied with electrical power, generates a magnetic field 962 capable of actuating the magnetically-movable member 940 to momentarily actuate the switch. The magnetic switch 940 may be coupled to the controller 920 such that one embodiment involving application of a magnetic field toggles the reset mode or initiates a reset.

The magnetic switch 940 may be desirable to set the reset mode or to initiate a reset when the monitoring device is accessible by passersby and it is desirable to prevent persons from tampering with the reset mode or from triggering a reset. The magnetic switch 940 also may be desirable when the monitoring device is not readily accessible without moving the movable object; the magnetic switch 940 may be actuated by a magnetic field that can pass through such a physical object. It should be appreciated that it may not be desirable to use a magnetic switch to both change the reset mode and to initiate a reset because application of the same magnetic field may trigger both switches when it is only desirable to trigger one of them.

FIG. 9C shows a wireless switch 970, such as a radio frequency ("RF") switch, that may be used to set the reset mode or to initiate a reset. For example, the magnetic switch may include a reed switch. The wireless switch 970 includes a receiver (or may use the wireless receiver 832 of the controller 820 of the monitoring device 800 of FIG. 8, as previously described) that receives a signal to change the reset mode of the monitoring device or to initiate a reset. The wireless receiver 980 may receive a signal from a wireless transmitter 990 that generates a wireless signal 992. The remote alarm device 148 of FIGS. 1A, 4A, and 7A, for example, may include a wireless transmitter to change a reset mode or to initiate a reset.

The wireless switch 970 may be desirable to set the reset mode or to initiate a reset when the monitoring device is accessible by passersby and it is desirable to prevent persons from tampering with the reset mode or from triggering a reset. The wireless switch 970 also may be desirable when the monitoring device is not readily accessible without moving the movable object; the wireless switch 970 may be actuated by a wireless signal that can pass through such a physical object. It should be appreciated that, unlike a magnetic switch, it may be feasible or desirable to use a wireless switch to both change the reset mode and to initiate a reset; wireless signals at different frequencies or carrying different coded signals may be used to separately change a reset mode or to initiate a reset.

Figure 10:
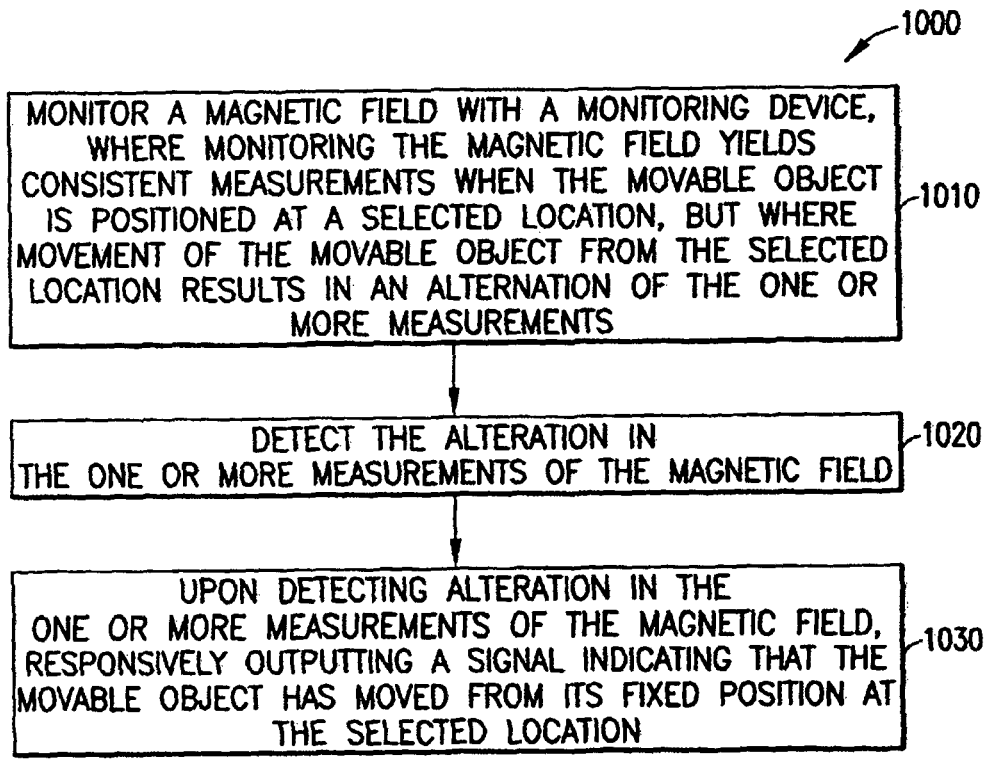
FIG. 10 is a flow diagram of an embodiment of a method for securing a theft-susceptible movable object at a selected location by monitoring for alteration in measurements of a magnetic field indicative of movement of the movable object.

FIG. 10 is a flow diagram of an embodiment of a method 1000 for securing a theft-susceptible movable object at a selected location by monitoring to detect alteration in measurements of a magnetic field indicative of movement of the movable object.

The method 1000 may for example be performed using a system of a type described with reference to FIGS. 1A-8. The method 1000 may be practiced, for example, employing a magnetic field source 120 positionally-associated with a movable object 110 and a monitoring device 140 placed proximate to a selected location 114 for the movable object 110, as shown in FIGS. 1A and 1B. Alternatively, the method 1000 may be practiced, for example, employing a monitoring device 440 positionally-associated with the movable object 110 and a magnetic field source 420 placed proximate to a selected location 114 for the movable object 110, as shown in FIGS. 4A and 4B. Further alternatively, the method 1000 may be practiced employing a monitoring device 740 configured to detect alterations of measurements of an ambient magnetic field, as described with reference to FIGS. 7A and 7B.

At 1010, a magnetic field (generated by a passive magnetic field source or an ambient magnetic field) is monitored with a monitoring device, where monitoring the magnetic field yields consistent measurements when the movable object is positioned at a selected location, but where movement of the movable object from the selected location results in an alteration of the one or more measurements. At 1020, the alteration in the one or more measurements of the magnetic field is detected. Thus, for example, as described with reference to FIGS. 1A and 1B, when the painting 110 in the frame 112 moves from the selected location 114, the measurements of the magnetic field 133 read by the monitoring device 140 will change. Similarly, as described with reference to FIGS. 4A and 4B, when the painting 110 in the frame 112 moves from the selected location 114, the measurements of the magnetic field 422 read by the monitoring device 440 will change. Also, as described with reference to FIGS. 7A and 7B, when the painting 110 in the frame 112 moves from the selected location 114, the measurements of the ambient magnetic field 722 read by the monitoring device 740 will change At 1030, upon detecting alteration of the magnetic field at the selected location that is indicative of movement of the movable object from the selected location, responsively outputting a signal indicating that the movable object has moved from its fixed position at the selected location. Thus, as previously described, when the movable object is moved from the selected location, at least one of a signal to a remote alarm or an audible alarm signal is generated.

Figure 11:
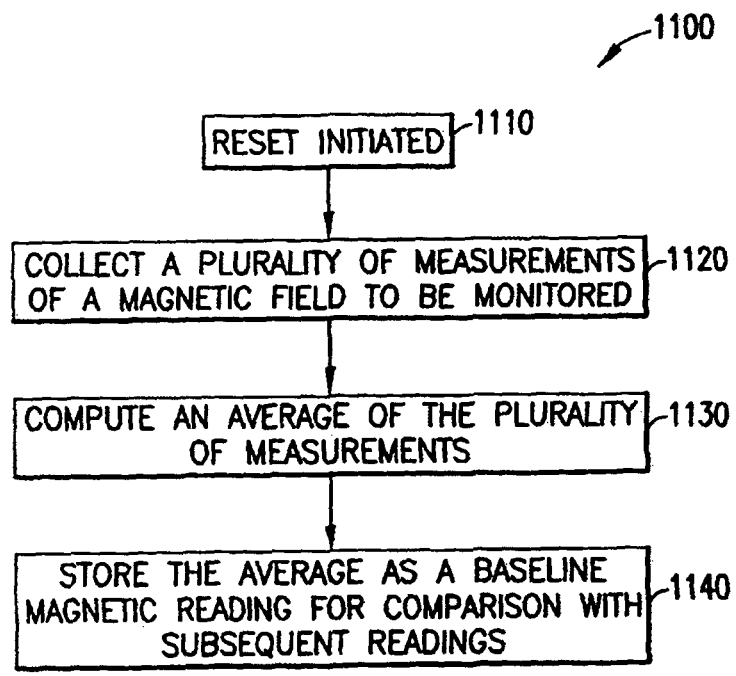
FIG. 11 is a flow diagram of an embodiment of a method for establishing a baseline measurement of a magnetic field upon reset of a monitoring device.

FIG. 11 is a flow diagram of an embodiment of a method 1100 for establishing a baseline measurement of a magnetic field upon reset of a monitoring device. At 1110, a reset is initiated. As previously described, the reset may be initiated automatically upon activation or power-up of the monitoring device and/or at predetermined intervals. Alternatively, the reset may be initiated by a manual signal received from a manual switch, magnetic switch, or wireless switch, as described with reference to FIGS. 9A, 9B, and 9C. At 1120, a plurality of measurements of a magnetic field to be monitored is collected. For example, the measurements may be collected by the controller 820 of the monitoring device of FIG. 8 directing the compass sensor 810 to take multiple measurements. The controller 820 then may store the measurements in the memory 822 of the controller 820, as previously described.

At 1130, an average of the plurality of measurements may be computed. At 1140, the computed average may be stored as a baseline magnetic reading for comparison with subsequent readings. A change in the subsequent readings from the baseline magnetic reading may signify an alteration in the magnetic readings that indicates movement of the movable object.

While embodiments have been has been described herein in reference to specific aspects, features and illustrative embodiments of the disclosure, it will be appreciated that the utility of the embodiments is not thus limited, but rather extends to and encompasses numerous other variations, modifications and alternative embodiments, as will suggest themselves to those of ordinary skill in the field, based on the disclosure herein. Correspondingly, the embodiments as hereinafter claimed are intended to be broadly construed and interpreted, as including all such variations, modifications and alternative embodiments, within their spirit and scope.

It will be understood that although described with reference to different aspects, or embodiments, the features and elements of any specific implementation herein may be utilized, to the extent compatible, with any other features and elements herein disclosed, in other implementations of the present disclosure. It will also be appreciated that subassemblies and super-assemblies of features and elements are contemplated by the present disclosure, within the scope of the preceding description.

What is claimed is:

1. A security system for protection of a theft-susceptible movable object positioned at a selected location, the security system comprising:
   a passive magnetic field source adapted to generate a magnetic field; and
   a monitoring device comprising a magnetic sensor, wherein the monitoring device is further adapted to: take one or more measurements of the magnetic field; detect alteration in the one or more measurements of the magnetic field caused by movement of the movable object; and output an electronic warning signal indicating that the movable object has moved from the selected location;
   wherein the magnetic field source and the monitoring device are cooperatively configured in one of the following configurations (I) and (II):
   (I) the magnetic field source adapted to generate the magnetic field, wherein the magnetic field is adapted to be positionally-associated with the movable object, the monitoring device being adapted for placement proximate to the selected location, and the monitoring device being adapted to detect the alteration in the one or more measurements of the magnetic field caused by movement of the magnetic field source relative to the monitoring device when the movable object is moved from the selected location; and
   (II) the magnetic field source adapted to generate the magnetic field, wherein the magnetic field source is adapted for placement in proximity to the selected location, the monitoring device being adapted to be positionally-associated with the movable object, and the monitoring device being adapted to detect the alteration in the one or more measurements of the magnetic field caused by movement of the monitoring device relative to the magnetic field source when the movable object is moved from the selected location.

2. A security system for protection of a theft-susceptible movable object positioned at a selected location, the security system comprising:
   a magnetic field source adapted to generate a magnetic field; and
   a monitoring device comprising a magnetic sensor, wherein the monitoring device is further adapted to: take one or more measurements of the magnetic field; detect alteration in the one or more measurements of the magnetic field caused by movement; and output an electronic warning signal indicating that the movable object has moved from the selected location;
   wherein the magnetic field source and the monitoring device are cooperatively configured in the following configuration:
   the magnetic field source adapted to generate the magnetic field, wherein the magnetic field source is adapted to be positionally-associated with the movable object, the monitoring device being adapted for placement proximate to the selected location, and the monitoring device being adapted to detect the alteration in the one or more measurements of the magnetic field caused by movement of the magnetic field source relative to the monitoring device when the movable object is moved from the selected location.

3. The security system of claim 2, wherein the magnetic field source is adapted to be positionally-associated with the movable object by securing the magnetic field source to one of the movable object and a structure physically attached to the movable object, and the monitoring device is positioned adjacent to the selected location but not physically attached to the movable object or the structure.

4. The security system of claim 3, wherein the movable object is adapted for being hung on a wall and the structure includes a frame, and wherein the magnetic field source is positionally-associated with the movable object by affixing the magnetic field source to one of the movable object and the frame.

5. The security system of claim 2, wherein the monitoring device is adapted to be placed within an operating range of 15 centimeters of the magnetic field source when the monitoring device is in operation.

6. The security system of claim 2, wherein the monitoring device is adapted to engage the magnetic sensor to take the one or more measurements of the magnetic field to detect the alteration of the magnetic field at the selected location at first predetermined intervals.

7. The security system of claim 2, wherein the monitoring device is further adapted to determine a baseline magnetic reading, wherein the monitoring device is adapted to detect the alteration in the one or more measurements of the magnetic field when the one or more measurements of the magnetic field differ from the baseline magnetic reading by more than a threshold amount.

8. The security system of claim 7, wherein the monitoring device is adapted to determine the baseline magnetic reading by: taking a plurality of measurements of the magnetic field at second predetermined intervals; calculating an average of the plurality of measurements; and storing the average of the plurality of measurements as the baseline magnetic reading.

9. The security system of claim 7, wherein the monitoring device is adapted to determine the baseline magnetic reading upon receiving a reset signal, wherein the monitoring device further comprises a magnetically-controlled switch, wherein a state change of the magnetically-controlled switch presents the reset signal, and wherein the state change of the magnetically-controlled switch is caused by application of a second magnetic field at the monitoring device, wherein a second field strength of the second magnetic field as received at the magnetic sensor exceeds a first strength of the magnetic field generated by the magnetic field source as received at the magnetic sensor.

10. The security system of claim 7, wherein the monitoring device is adapted to be switchable to either update the baseline magnetic signal automatically or to update the baseline magnetic signal in response to a reset signal, and wherein the magnetic sensor is adapted to be switchable to either update the baseline magnetic signal automatically or to update the baseline signal in response to the reset signal by one of: changing a position of a physical mode switch incorporated in the monitoring device; changing a position of a jumper block incorporated in the monitoring device; receipt of a wireless signal; and receipt of a magnetic signal.

11. The security system of claim 1, further comprising an alarm device remotely located from the monitoring device receiving the electronic warning signal and producing an alarm.

12. The security system of claim 1, further comprising configuration (II) and an alarm device remotely located from the monitoring device receiving the electronic warning signal and producing an alarm, wherein the monitoring device is adapted to be positionally-associated with the movable object by securing the monitoring device to one of the movable object and a structure physically attached to the movable object, and the magnetic field source is adapted to be positioned adjacent to the selected location but not physically attached to the movable object or the structure.

13. The security system of claim 12, wherein the movable object is adapted to being hung on a wall and the structure includes a frame, and wherein the monitoring device is positionally-associated with the movable object by affixing the monitoring device to one of the movable object and the frame.

14. The security system of claim 11, wherein the monitoring device is adapted to be placed within an operating range of 15 centimeters of the magnetic field source when the monitoring device is in operation.

15. The security system of claim 11, wherein the monitoring device is adapted to engage the magnetic sensor to take the one or more measurements of the magnetic field to detect the alteration of the magnetic field at the selected location at first predetermined intervals.

16. The security system of claim 11, wherein the monitoring device is further adapted to determine a baseline magnetic reading, wherein the monitoring device is adapted to detect the alteration in the one or more measurements of the magnetic field when the one or more measurements of the magnetic field differ from the baseline magnetic reading by more than a threshold amount.

17. The security system of claim 16, wherein the monitoring device is adapted to determine the baseline magnetic reading by: taking a plurality of measurements of the magnetic field at second predetermined intervals; calculating an average of the plurality of measurements; and storing the average of the plurality of measurements as the baseline magnetic reading.

18. The security system of claim 16, wherein he monitoring device is adapted to determine the baseline magnetic reading upon receiving a reset signal, wherein the monitoring device further comprises a magnetically-controlled switch, wherein a state change of the magnetically-controlled switch presents the reset signal, and wherein wherein the state change of the magnetically-controlled switch is caused by application of a second magnetic field at the monitoring device, wherein a second field strength of the second magnetic field as received at the magnetic sensor exceeds a first strength of the magnetic field generated by the magnetic field source as received at the magnetic sensor.

19. The security system of claim 16, wherein the monitoring device is adapted to be switchable to either update the baseline magnetic signal automatically or to update the baseline magnetic signal in response to a reset signal, and wherein the magnetic sensor is adapted to be switchable to either update the baseline magnetic signal automatically or to update the baseline signal in response to the reset signal by one of: changing a position of a physical mode switch incorporated in the monitoring device; changing a position of a jumper block incorporated in the monitoring device; receipt of a wireless signal; and receipt of a magnetic signal.

20. The security system of claim 1, installed at a premises to protect the movable object from being removed from the premises.

* * * * *